United States Patent
Kim et al.

(10) Patent No.: US 10,971,247 B2
(45) Date of Patent: Apr. 6, 2021

(54) SEMICONDUCTOR MEMORY DEVICES, MEMORY SYSTEMS, AND METHODS OF OPERATING SEMICONDUCTOR MEMORY DEVICES

(71) Applicant: Samsung Electronics Co., Ltd., Suwon-si (KR)

(72) Inventors: Kyung-Ryun Kim, Seoul (KR); Yoon-Na Oh, Seongnam-si (KR); Hyung-Jin Kim, Uiwang-si (KR); Hui-Kap Yang, Hwaseong-si (KR); Jang-Woo Ryu, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/283,650

(22) Filed: Feb. 22, 2019

(65) Prior Publication Data
US 2019/0304565 A1 Oct. 3, 2019

(30) Foreign Application Priority Data

| Mar. 29, 2018 | (KR) | 10-2018-0036291 |
| Jul. 9, 2018 | (KR) | 10-2018-0079345 |
| Oct. 5, 2018 | (KR) | 10-2018-0119317 |
| Jan. 30, 2019 | (KR) | 10-2019-0011563 |

(51) Int. Cl.
| *G11C 8/12* | (2006.01) |
| *G11C 29/00* | (2006.01) |
| *G11C 29/24* | (2006.01) |
| *G11C 29/44* | (2006.01) |
| *G11C 29/04* | (2006.01) |

(52) U.S. Cl.
CPC ............ *G11C 29/787* (2013.01); *G11C 8/12* (2013.01); *G11C 29/24* (2013.01); *G11C 29/44* (2013.01); *G11C 2029/0411* (2013.01)

(58) Field of Classification Search
CPC ...................................................... G11C 8/12
USPC ..................................................... 365/200
See application file for complete search history.

(56) References Cited

U.S. PATENT DOCUMENTS

| 6,327,197 | B1 | 12/2001 | Kim et al. | |
| 6,657,878 | B2 * | 12/2003 | Lien ............. | G11C 15/00 365/225.7 |
| 6,862,232 | B2 * | 3/2005 | Hanzawa ......... | G11C 7/14 365/158 |
| 6,870,780 | B2 | 3/2005 | Park et al. | |
| 7,218,558 | B2 | 5/2007 | Kang et al. | |
| 7,251,173 | B2 | 7/2007 | Lunde et al. | |
| 8,120,957 | B2 * | 2/2012 | Tokiwa ............. | G11C 16/06 365/185.09 |

(Continued)

FOREIGN PATENT DOCUMENTS

| KR | 10-2005-0037144 A | 4/2005 |
| KR | 10-2006-0023690 A | 3/2006 |

*Primary Examiner* — Muna A Techane
(74) *Attorney, Agent, or Firm* — Muir Patent Law, PLLC

(57) ABSTRACT

A method includes replacing an address of a first normal memory cell in a first column of a first memory block with a destination address that is an address of a second normal memory cell in a second column of the first memory block, and reassigning the address of the second normal memory cell in the second column of the first memory block to an address of a first redundancy memory cell in a redundancy block of the memory device.

10 Claims, 34 Drawing Sheets

(56) References Cited

U.S. PATENT DOCUMENTS

| | | | |
|---|---|---|---|
| 8,982,596 B1 * | 3/2015 | Srinivasan | G11C 29/24 365/49.16 |
| 9,372,771 B1 * | 6/2016 | Maheshwari | G11C 29/44 |
| 2013/0314992 A1 * | 11/2013 | Takagiwa | G11C 29/04 365/185.09 |

* cited by examiner

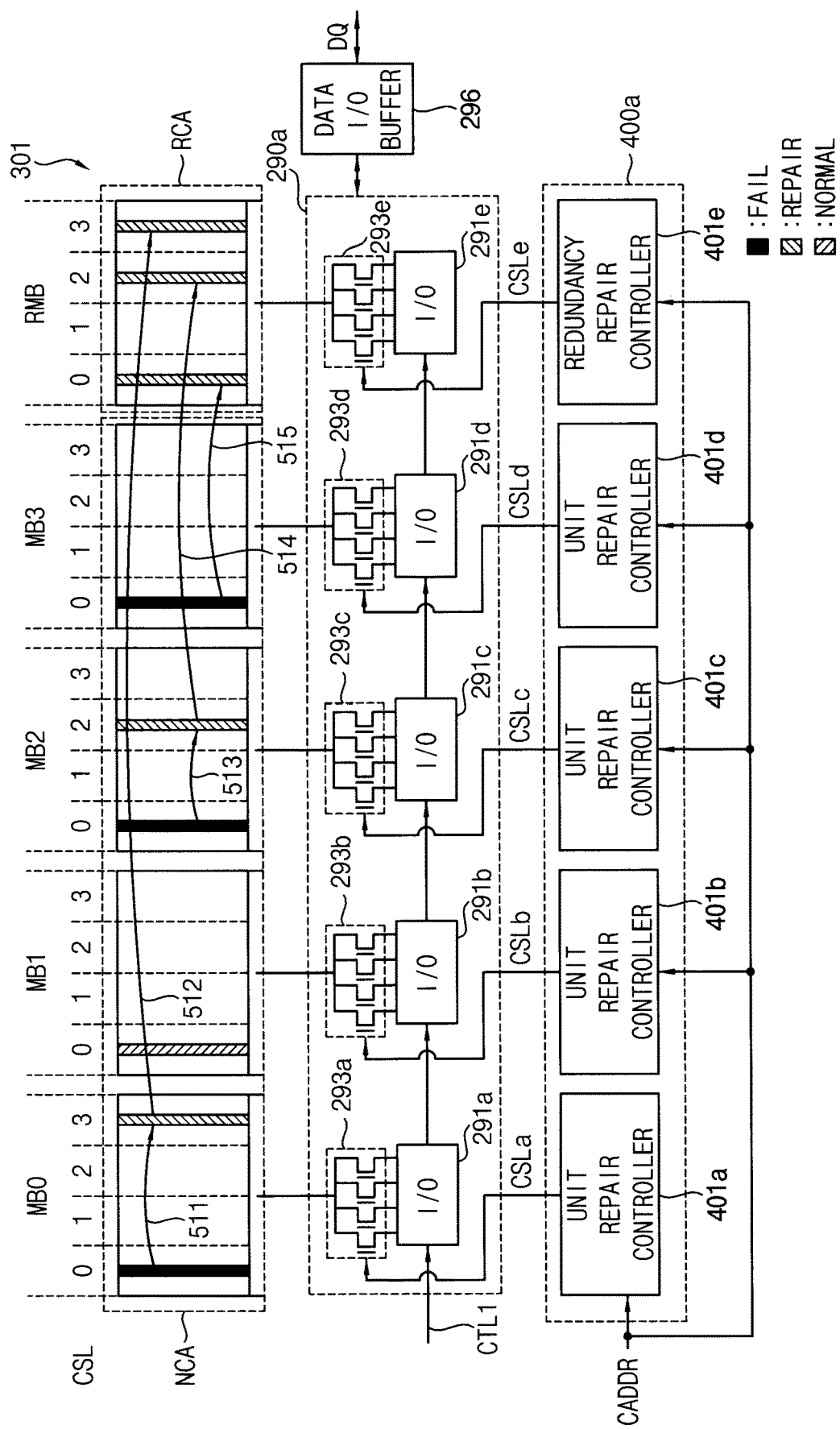

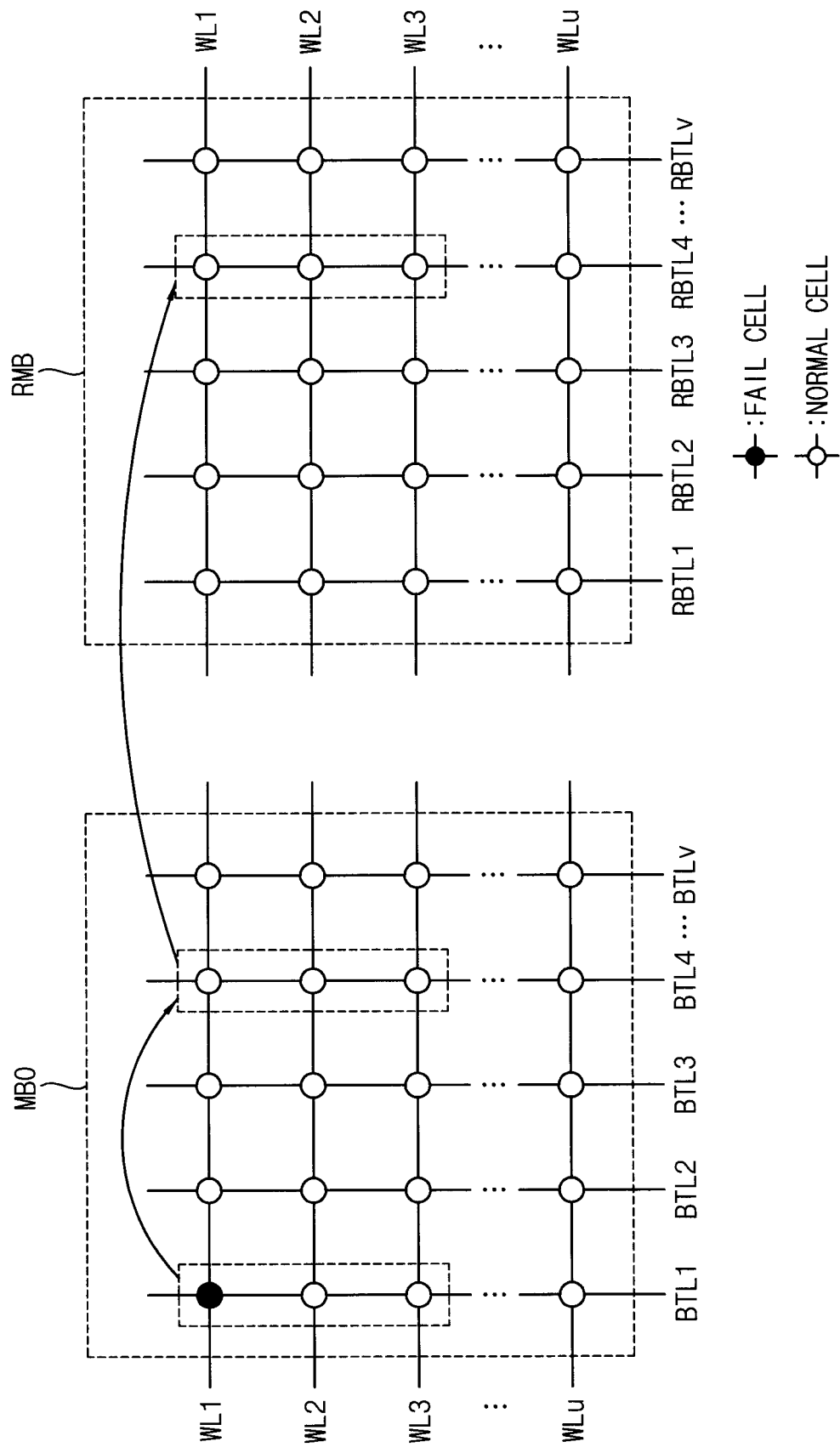

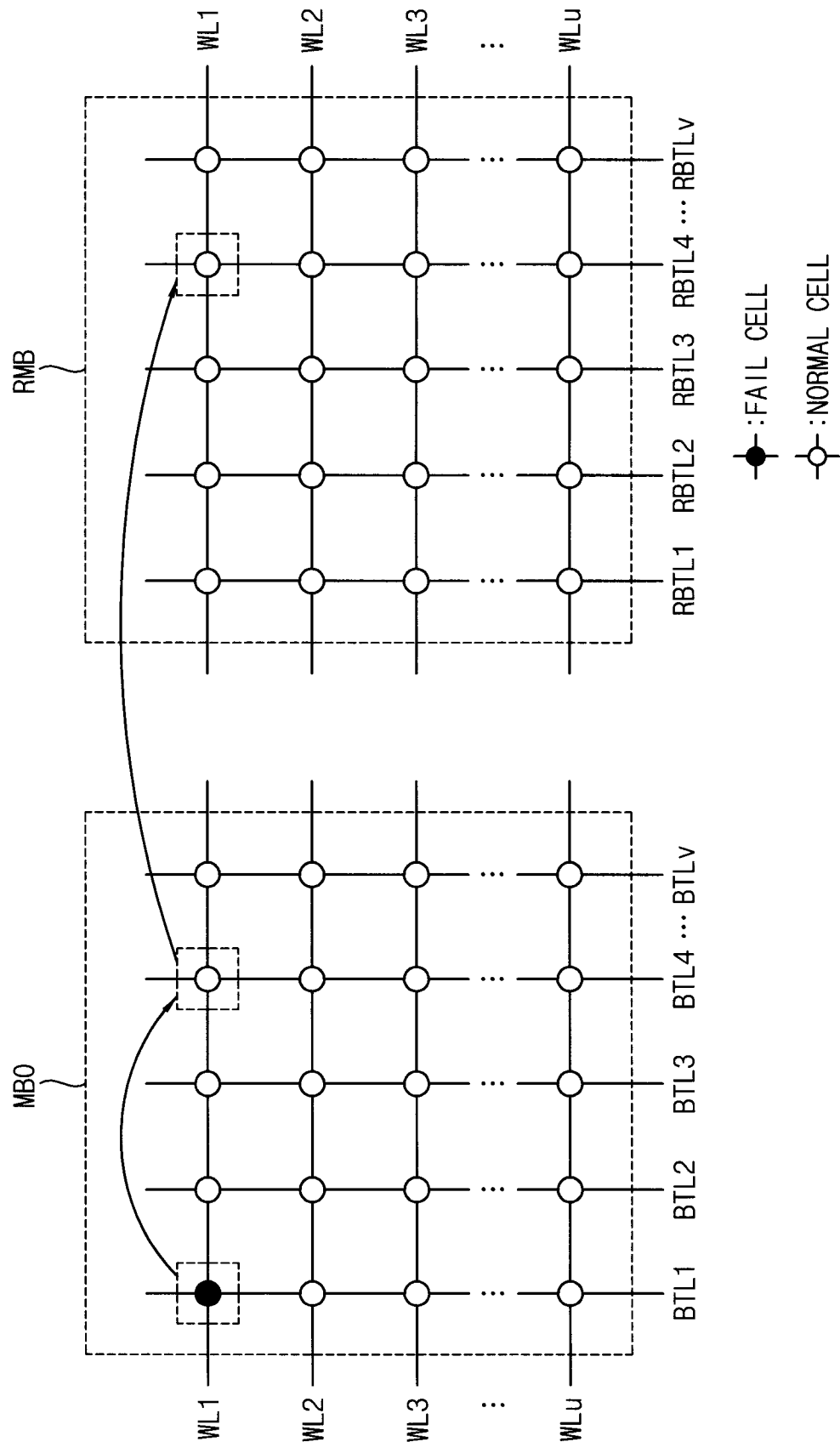

FIG. 17B

| MFB(2b) | FFI(4b) |
|---|---|
| 00 | Not used |
| 01 | 16 Addresses |
| 10 | 16 Addresses |
| 11 | 16 Addresses |

FIG. 17C

| SR-DS(10b) | MFB&DS(3b) | MB(1b) | SRFI(6b) |

FIG. 17D

|  | MFB | | | CADDR | | |
|---|---|---|---|---|---|---|
|  | S[9] | S[8] | S[7] | CA9 | CA8 | CA7 |
| No Repair | 0 | 0 | 0 | CA9 | CA8 | CA7 |
| Repair | 0 | 0 | 1 | CA9 | CA8 | /CA7 |
|  | 0 | 1 | 0 | CA9 | /CA8 | CA7 |
|  | 0 | 1 | 1 | CA9 | /CA8 | /CA7 |
|  | 1 | 0 | 0 | /CA9 | CA8 | CA7 |
|  | 1 | 0 | 1 | /CA9 | CA8 | /CA7 |
|  | 1 | 1 | 0 | /CA9 | /CA8 | CA7 |
|  | 1 | 1 | 1 | /CA9 | /CA8 | /CA7 |

1

SEMICONDUCTOR MEMORY DEVICES, MEMORY SYSTEMS, AND METHODS OF OPERATING SEMICONDUCTOR MEMORY DEVICES

CROSS-REFERENCE TO RELATED APPLICATIONS

This U.S. application claims the benefit of priority under 35 USC § 119 to Korean Patent Application No. 10-2018-0036291, filed on Mar. 29, 2018 to Korean Patent Application No. 10-2018-0079345, filed on Jul. 9, 2018, to Korean Patent Application No. 10-2018-0119317, filed on Oct. 5, 2018 and to Korean Patent Application No. 10-2019-0011563, filed on Jan. 30, 2019 in the Korean Intellectual Property Office, the disclosures of which are incorporated by reference in their entirety herein.

BACKGROUND

The present disclosure relates to memories, and more particularly to semiconductor memory devices, methods of operating semiconductor memory devices and memory systems.

Semiconductor chips are manufactured through semiconductor manufacturing processes, and then tested by a test device in a wafer, a die, or a package state. Defective portions of defective chips are selected through a test, and if some of memory cells are defective, repair operations are performed to save semiconductor chips. Currently, semiconductor chips such as dynamic random access memories (DRAMs) have continued to be reduced in size through fine processes, and accordingly, the possibility of errors occurring during the manufacturing process has increased. In addition, if defects are not detected through initial test processes, errors may occur during chip operations.

One way to correct errors is by using redundancy memory blocks, which includes an array of memory cells that serve as backup cells for cells in normal memory blocks that fail. However, adding redundancy memory blocks typically increases the overall size of the memory cell array and memory chip. Therefore, it would be beneficial to perform redundancy in a manner that allows for a smaller increase in the size of a memory chip.

SUMMARY

Accordingly, a repair control circuit in a semiconductor memory device may repair a fail cell in at least one of memory blocks with at least one normal cell in the same memory block at least once and may replace the normal cell using a redundancy cell in a redundancy block. Therefore, the semiconductor memory device may use redundancy resources in the redundancy block with greater efficiency.

According to exemplary embodiments, which may be part of one of more of the embodiments described elsewhere in this summary, a method replaces a memory cell in a first column of a memory block in a memory device including a plurality of memory blocks and at least a first redundancy block. The method includes replacing an address of a first normal memory cell in a first column of a first memory block with a destination address that is an address of a second normal memory cell in a second column of the first memory block, and reassigning the address of the second normal memory cell in the second column of the first memory block to an address of a first redundancy memory cell in a redundancy block of the memory device.

According to exemplary embodiments, which may be part of one of more of the embodiments described elsewhere in this summary, a memory device includes a plurality of memory blocks including a first memory block, each memory block including a plurality of columns of normal memory cells, at least a first redundancy block, the first redundancy block including a plurality of columns of redundancy memory cells, and a repair control circuit. The repair control circuit is configured to cause a second column of normal memory cells of the first memory block to serve as a destination column for a first column of normal memory cells of the first memory block, and to cause a first column of redundancy memory cells of the redundancy memory block to store data destined for the second column of normal memory cells of the first memory block.

According to exemplary embodiments, which may be part of one of more of the embodiments described elsewhere in this summary, a memory device includes a plurality of memory blocks including a first memory block, each memory block including a plurality of columns of normal memory cells, at least a first redundancy block, the first redundancy block including a plurality of columns of redundancy memory cells, and a repair control circuit. The repair control circuit is configured to replace a first normal memory cell in a first column of the first memory block with a second normal memory cell in a second column of the first memory block, and to replace the second normal memory cell of the second column of the first memory block by using a first redundancy memory cell in a first column of redundancy memory cells of the first redundancy block. Replacing the second normal memory cell by using the first redundancy memory cell may include causing the first redundancy memory cell to store data destined for the second normal memory cell.

According to exemplary embodiments, which may be part of one of more of the embodiments described elsewhere in this summary, a memory device includes a plurality of memory blocks including a first memory block, each memory block including a plurality of columns of normal memory cells, at least a first redundancy block, the first redundancy block including a plurality of columns of redundancy memory cells, and a repair control circuit. The repair control circuit is configured to replace a first normal memory cell in a first column of the first memory block with a second normal memory cell in a second column of the first memory block, and to replace the second normal memory cell of the second column of the first memory block by using a first redundancy memory cell in a first column of redundancy memory cells of the first redundancy block. Replacing the second normal memory cell by using the first redundancy memory cell may include replacing the second normal memory cell with a third normal memory cell in a first column of a second memory block of the memory device, and replacing a normal memory cell from among the second normal memory cell and other normal memory cells of the second memory block or other memory blocks of the memory device with the first redundancy memory cell.

According to exemplary embodiments, which may be part of one of more of the embodiments described elsewhere in this summary, a memory device includes a plurality of memory blocks including a first memory block, each memory block including a plurality of columns of normal memory cells, at least a first redundancy block, the first redundancy block including a plurality of columns of redundancy memory cells, and a repair control circuit. The repair control circuit is configured to replace a first normal memory cell in a first column of the first memory block with a second normal memory cell in a second column of the first memory block, and to replace the second normal memory cell of the second column of the first memory block by using a first redundancy memory cell in a first column of redundancy memory cells of the first redundancy block. Replacing the second normal memory cell by using the first redundancy memory cell may include replacing the second normal memory cell with a third normal memory cell in a first column of a second memory block of the memory device, and replacing a normal memory cell from among the second normal memory cell and other normal memory cells of the second memory block or other memory blocks of the memory device with the first redundancy memory cell.

According to exemplary embodiments, which may be part of one of more of the embodiments described elsewhere in this summary, a memory device, includes a plurality of normal memory blocks including a first memory block, each normal memory block including a plurality of columns of normal memory cells, at least a first redundancy block, the first redundancy block including a plurality of columns of redundancy memory cells, a plurality of column select lines for selecting the plurality of columns of the normal memory cells and the plurality of columns of the redundancy memory cells, each column select line associated with a column address, and a repair control circuit. The repair control circuit is configured to replace a first source address with a first destination address, wherein the first source address is the address of a first column select line connected to a first column of memory cells of the first memory block, and the first destination address is the address of a second column select line connected to a second column of memory cells of the first memory block, and replace the address of the second column select line with an address of a first column select line connected to a first column of the redundancy block.

BRIEF DESCRIPTION OF THE DRAWINGS

Exemplary embodiments will be described below in more detail with reference to the accompanying drawings.

FIG. 3 is a block diagram illustrating a portion of the semiconductor memory device in FIG. 2A according to exemplary embodiments.

FIGS. 9A to 9C are diagrams for describing methods of replacing a fail cell with a normal cell in the same memory block and replacing the normal cell with a redundancy cell.

FIG. 17B illustrates an example that reduces a number of fuses associated with a repair operation according to example embodiments.

FIG. 17C illustrates another example that reduces a number of fuses associated with a repair operation according to example embodiments.

FIG. 17D illustrates an example that implements the example of FIG. 17C in detail.

DETAILED DESCRIPTION

Various exemplary embodiments will be described more fully hereinafter with reference to the accompanying drawings, in which exemplary embodiments are shown.

As seen in various claims and in the specification, certain items described herein are described using the naming convention of "first," "second," "third," etc. Unless the context indicates otherwise, these terms are only used to distinguish different items from each other and do not necessarily indicate a physical positioning or operational ordering of the items. Thus, different naming terms, such as "first," "second," etc., may be used to refer to a particular item or object, either in the specification or in different claims, depending on the context of the discussion.

Figure 1:
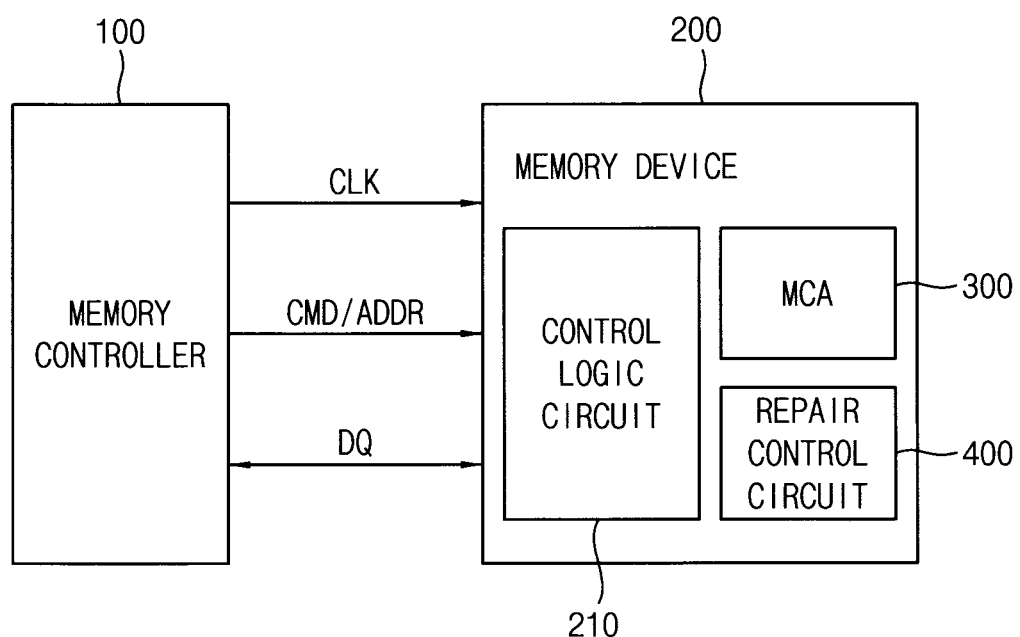
FIG. 1 is a block diagram illustrating a memory system according to exemplary embodiments.

FIG. 1 is a block diagram illustrating a memory system according to exemplary embodiments.

Referring to FIG. 1, a memory system 20 may include a memory controller 100 and a semiconductor memory device 200.

The memory controller 100 may control overall operation of the memory system 20. The memory controller 100 may control overall data exchange between an external host and the semiconductor memory device 200. For example, the memory controller 100 may write data in the semiconductor memory device 200 or read data from the semiconductor memory device 200 in response to a request from the host. In addition, the memory controller 100 may issue operation commands to the semiconductor memory device 200 for controlling the semiconductor memory device 200.

In some embodiments, the semiconductor memory device 200 is a memory device including dynamic memory cells such as a dynamic random access memory (DRAM), double data rate 4 (DDR4) synchronous DRAM (SDRAM), a low power DDR4 (LPDDR4) SDRAM or a LPDDR5 SDRAM.

The memory controller 100 transmits a clock signal CLK, a command CMD and an address (signal) ADDR to the semiconductor memory device 200 and exchanges data DQ with the semiconductor memory device 200.

The semiconductor memory device 200 includes a memory cell array 300 that stores the data DQ, a control logic circuit 210, and a repair control circuit 400. The memory cell array 300 may include a plurality of memory blocks and at least one redundancy block.

The control logic circuit 210 controls an access to the memory cell array 300 based on the command CMD and the address ADDR, and the repair control circuit 400 may repair and therefore replace a fail cell in a first memory block of the plurality of memory blocks with a normal cell in the first memory block and may replace the first normal cell with a redundancy cell in the redundancy block. Therefore, the repair control circuit 400 may use redundancy resources in the redundancy block with greater efficiency.

For example, the repair control circuit 400 may replace a memory cell in one memory block with a normal cell in the same memory block at least once and may then replace the normal cell with a redundancy cell. Thus, instead of simply repairing a fail cell with only redundancy cells, a first replaced memory cell may be a fail cell which may be repaired with a normal cell, and that normal cell may be replaced with a redundancy cell, or may be replaced with other normal cells, such that a final normal cell in a series of replacement normal cells is replaced with a redundancy cell. Therefore, the repair control circuit 400 may use redundancy resources in the redundancy block with greater efficiency.

Figure 2A:
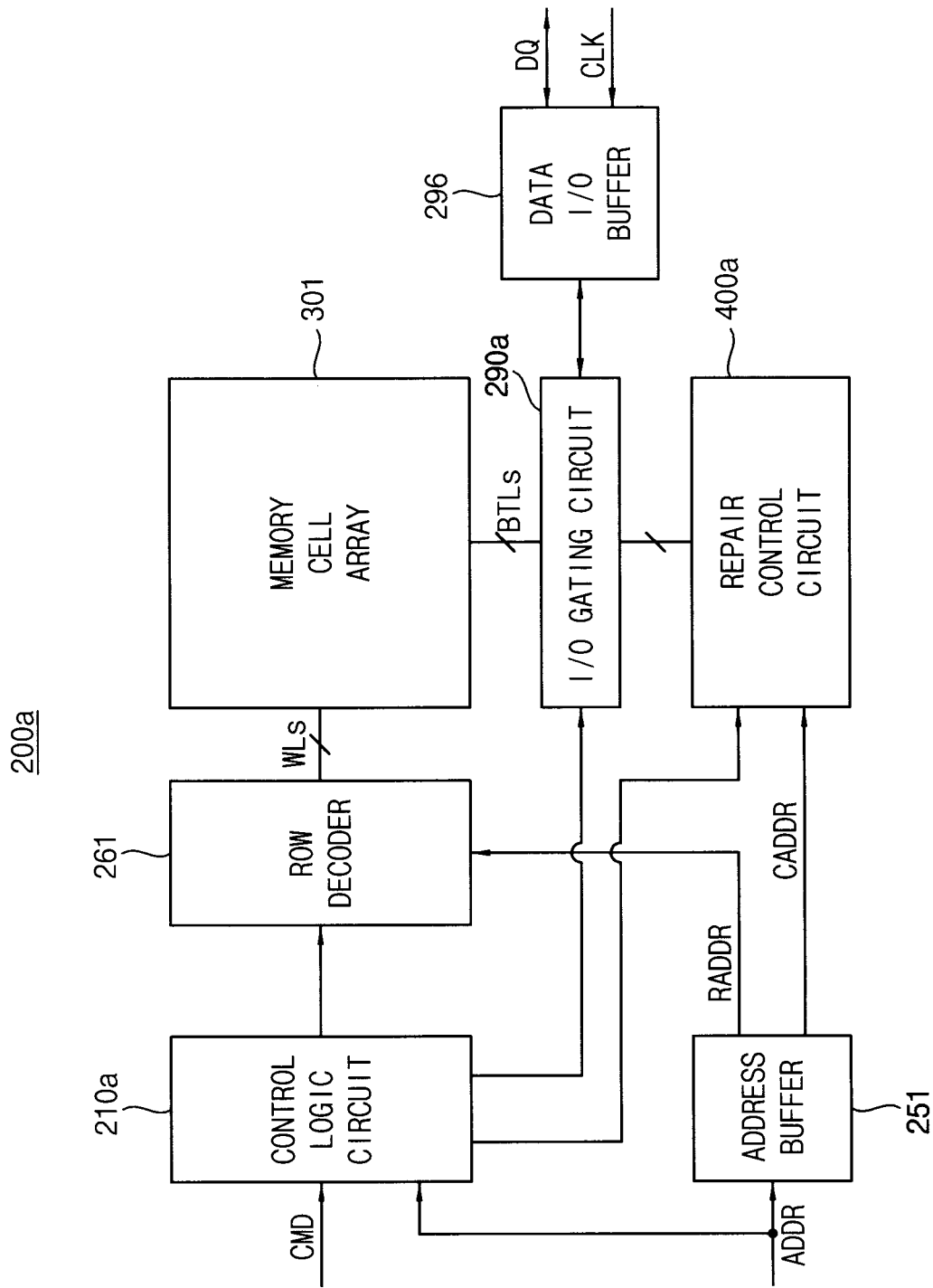
FIG. 2A is a block diagram illustrating an example of the semiconductor memory device in FIG. 1 according to exemplary embodiments.

FIG. 2A is a block diagram illustrating an example of the semiconductor memory device in FIG. 1 according to exemplary embodiments.

Referring to FIG. 2A, a semiconductor memory device 200a may include a control logic circuit 210a, an address buffer 251, a repair control circuit 400a, a row decoder 261, an input/output (I/O) gating circuit 290a, a data I/O buffer 296 and a memory cell array 301.

The control logic circuit 210a receives the command CMD and the access address ADDR. The control logic circuit 210a may control operation of the semiconductor memory device 200a based on the command CMD the access address ADDR. The control logic circuit 210a may control the row decoder 261, the I/O gating circuit 290a and the repair control circuit 400a based on the command CMD the address ADDR.

The address buffer 251 receives the access address ADDR, provides a row address RADDR of the access address ADDR to the row decoder 261 and provides a column address CADDR of the access address ADDR to the repair control circuit 400a. The repair control circuit 400a may repair the fail cell in one memory block with a normal cell in the same memory block at least once and may replace the normal cell with a redundancy cell based on a comparison of the column address CADDR with a fail column address stored therein.

The row decoder 261 is coupled to the memory cell array 301 through word-lines WLs and the I/O gating circuit 290a is coupled to the memory cell array 301 through bit-lines BTLs. The data I/O buffer 296 receives/transmits data DQ with the memory controller 100 through the I/O gating circuit 290a.

Figure 2B:
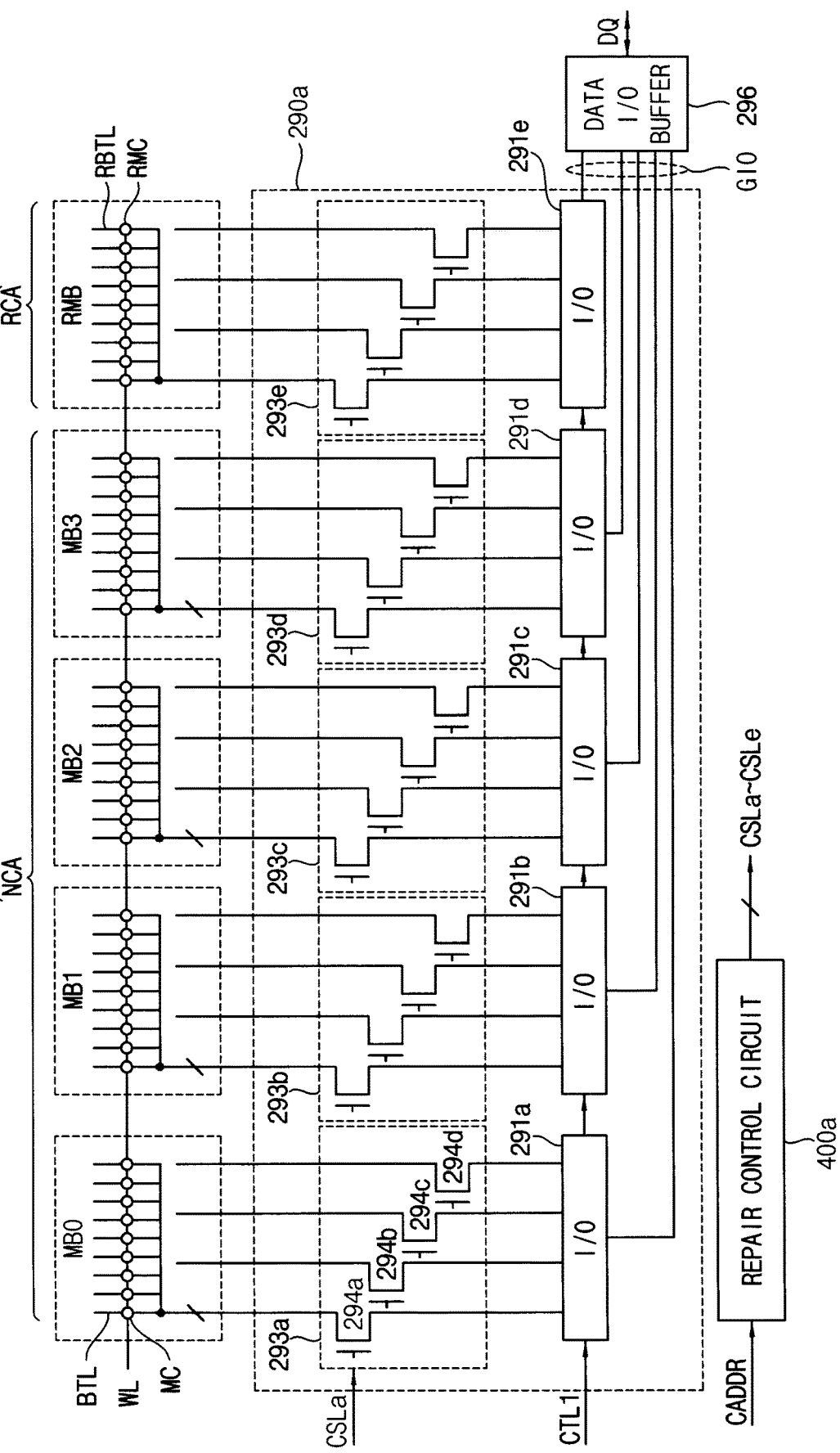
FIG. 2B illustrates a portion of the semiconductor memory device of FIG. 2A according to exemplary embodiments.

FIG. 2B illustrates a portion of the semiconductor memory device of FIG. 2A according to exemplary embodiments.

In FIG. 2B, the memory cell array 301, the I/O gating circuit 290a, the data I/O buffer 296 and the repair control circuit 400a are illustrated.

Referring to FIG. 2B, the memory cell array 301 includes a normal cell array NCA and a redundancy cell array RCA, the normal cell array NCA includes a plurality of memory blocks MB0, MB1, MB2 and MB3 and the redundancy cell array RCA includes at least one redundancy block RMB. The normal cell array RCA includes memory cells MCs coupled to a word-line WL and bit-lines BTLs and the redundancy block RMB includes redundancy cells RMCs coupled to the word-line WL and redundancy bit-lines RBTLs.

The I/O gating circuit 290a includes a plurality of I/O circuits 291a, 291b, 291c and 291d and 291e and a plurality of column selection circuits 293a~293e and the column selection circuits 293a~293e may connect one of the I/O circuits 291a~291e to respective one of the memory blocks MB0~MB3 and the redundancy block RMB. Each of the column selection circuits 293a~293e may include a plurality of column selection transistors 294a~294d, and the plurality of column selection transistors 294a~294d connect a plurality of bit-lines or a bit-line in a corresponding memory block or in the redundancy block RMB to corresponding I/O circuit in response to column selection line signals CSLa~CSLe respectively. The plurality of I/O circuits 291a~291e may be coupled to the data I/O buffer 296 through data lines GIO in response to a first control signal CTL1 from the control logic circuit 210a.

Although not illustrated, the column selection line signal CSLb may be applied to the column selection circuit 293b, the column selection line signal CSLc may be applied to the column selection circuit 293c, the column selection line signal CSLd may be applied to the column selection circuit 293d, and the column selection line signal CSLe may be applied to the column selection circuit 293e.

The repair control circuit 400a may provide corresponding one of the column selection line signals CSLa~CSLe to respective one of the column selection circuits 293a~293e in response to the access column address CADDR. The access column address CADDR is provided from the address buffer 251 in FIG. 2A, and the access column address CADDR is an address to designate one bit-line without considering at least one fail cell in the memory blocks MB0~MB3. Each of the column selection line signals CSLa~CSLd is a signal to select corresponding bit-lines simultaneously in the memory blocks MB0~MB3 based on the access column address CADDR. The semiconductor memory device 200a may simultaneously input and output data having a size corresponding to a burst length in response to each of the column selection line signals CSLa~CSLd.

FIG. 3 is a block diagram illustrating a portion of the semiconductor memory device in FIG. 2A according to exemplary embodiments.

In FIG. 3, the memory cell array 301, the I/O gating circuit 290a, the repair control circuit 400a and the data I/O buffer 296 are illustrated. When FIG. 3 is compared with the FIG. 2B, the repair control circuit 400a is illustrated in detail, and there will be description on the repair control circuit 400a mainly.

Referring to FIG. 3, the memory cell array 301 includes the normal cell array NCA and the redundancy cell array RCA, the normal cell array NCA includes the plurality of memory blocks MB0, MB1, MB2 and MB3 and the redundancy cell array RCA includes at least one redundancy block RMB. The normal cell array RCA includes memory cells coupled to a word-line WL and bit-lines and the redundancy block RMB includes redundancy cells coupled to the word-line and redundancy bit-lines.

The repair control circuit 400a may include a plurality of unit repair controllers 401a~401d and a redundancy repair controller 401e, and the unit repair controllers 401a~401d and the redundancy repair controller 401e correspond to the memory blocks MB0, MB1, MB2 and MB3 and the redundancy block RMB. The repair control circuit 400a may be included, for example, in a column decoder in the semiconductor memory device 200a.

The plurality of I/O circuits 291a, 291b, 291c and 291d and 291e may control connection between the memory blocks MB0, MB1, MB2 and MB3 and the redundancy block RMB and the data I/O buffer 296 in response to the first control signal CTL1. The column selection circuits 293a~293e may connect one of the I/O circuits 291a~291e to a respective one of the memory blocks MB0~MB3 and the redundancy block RMB.

The unit repair controllers 401a~401d and the redundancy repair controller 401e may commonly receive the access column address (i.e., a column address) CADDR and may provide the corresponding column selection circuits 293a~293e with the column selection line signals CSLa~CSLe applied to the memory blocks MB0, MB1, MB2 and MB3 and the redundancy block RMB. For example, at a given time, the same access column address may be transmitted to each of the unit repair controllers 401a~401e. Based on the state of and the information stored in each unit repair controller 401a~401e, an output is transmitted to each respective column selection circuit 293a~293e, which is used to select a column for memory access.

When the memory blocks MB0, MB1, MB2 and MB3 do not include a fail cell, the I/O circuit 291e cuts off a connection between the redundancy block RMB and the data I/O buffer 296 in response to the first control signal CTL1 and the I/O circuits 291a~291d may transfer data DQ from the memory blocks MB0, MB1, MB2 and MB3 to the data I/O buffer 296 or may transfer data DQ from the data I/O buffer 296 to the memory blocks MB0, MB1, MB2 and MB3 through the column selection transistors 294a~294d in response to the first control signal CTL1. In this case, in each of the memory blocks MB0, MB1, MB2 and MB3, a bit-line or bit-lines at a same position (e.g., a same relative position within each memory block) may be selected in response to a corresponding one of the column selection line signals CSLa~CSLd, and the semiconductor memory device 200a may simultaneously input and output data having a size corresponding to a burst length of the semiconductor memory device 200a.

When at least one of the memory blocks MB0, MB1, MB2 and MB3 includes at least one fail cell, the I/O circuit 291e is connected to the redundancy block RMB in response to the first control signal CTL1 and a repair operation on the at least one fail cell may be performed.

For example, when each of the memory blocks MB0, MB2 and MB3 includes at least one fail cell on a first bit-line that would normally be selected by a column selection line signal CSL0, the fail cell in the memory block MB0 is repaired by a normal cell in the memory block MB0 by enabling a column selection line signal CSL3 instead of the column selection line signal CSL0 as a reference numeral 511 indicates. For example, the column selection transistor 294c instead of the column selection transistor 294a is connected to the memory block MB0 and the data I/O buffer 291a by enabling the column selection line signal CSL3 instead of the column selection line signal CSL0. As described further below, a respective unit repair controller may cause the enabling of the column selection line signal CSL3 instead of the column selection line signal CSL0. In addition, the normal cell (e.g., non-redundancy cell, which in this example is not a fail cell) in the memory block MB0 is replaced by a redundancy cell in the redundancy block RMB by selecting a redundancy bit-line instead of the bit-line in the memory block MB0 as a reference numeral indicates 512. For example, the repair control circuit 400a may repair the first fail cell with the first normal cell by enabling the column selection line signal CSL3 to select a second bit-line coupled to the first normal cell instead of enabling the column selection line signal CSL0 to select a first bit-line coupled to the first fail cell.

It is assumed that the memory block MB1 does not include a fail cell in any of the memory blocks, and so none of the columns of memory block MB1 need to be reassigned to or replaced with other columns.

The fail cell in the memory block MB2 is repaired by a normal cell in the memory block MB2 by enabling a column selection line signal CSL2 instead of the column selection line signal CSL0 as a reference numeral 513 indicates. In addition, the normal cell in the memory block MB2 is replaced by a redundancy cell in the redundancy block RMB by selecting a redundancy bit-line instead of the bit-line in the memory block MB2 as a reference numeral indicates 514. The fail cell in the memory block MB3 is repaired by a redundancy cell in the redundancy block RMB by selecting a redundancy bit-line instead of the bit-line in the memory block MB3 as a reference numeral indicates 515.

Figure 4A:
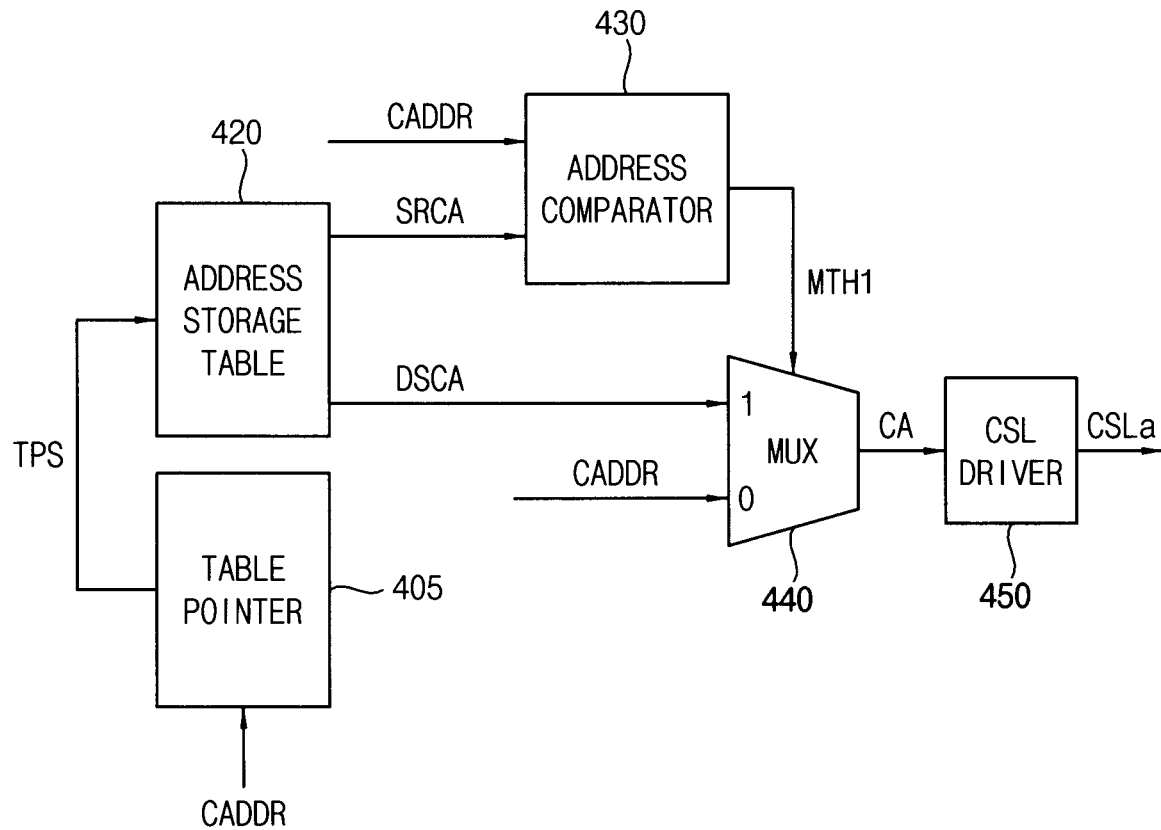
FIG. 4A is a block diagram illustrating an example of a first unit repair controller in the semiconductor memory device of FIG. 3 according to exemplary embodiments.

FIG. 4A is a block diagram illustrating an example of a first unit repair controller in the semiconductor memory device of FIG. 3 according to exemplary embodiments.

Referring to FIG. 4A, a first unit repair controller 401a may include a table pointer 405, an address storage table 420, a column address comparator 430, a selection circuit 440 and a column selection line driver 450.

The table pointer 405 may generate a table pointing signal TPS toggling in response to the column address CADDR which changes sequentially. The address storage table 420 may store at least one source column address SRCA and at least one destination column address DSCA corresponding to the at least one source column address SRCA as fuse information.

The column address comparator 430 compares the access column address CADDR with the source column address SRCA from the address storage table 420 and outputs a first match signal MTH1 indicating a result of the comparison. The selection circuit 440 may select one of the destination column address DSCA from the address storage table 420 and the access column address CADDR in response to the first match signal MTH1 to output a selected one as a target column address CA. The column selection line driver 450 may output the column selection line signal CSLa for selecting (enabling) a bit-line corresponding to the target column address CA.

When the access column address CADDR does not match the source column address SRCA, the selection circuit 440 may output the access column address CADDR as the target column address CA in response to the first match signal MTH1 (e.g., having a first value). When the access column address CADDR matches the source column address SRCA, the selection circuit 440 may output the destination column address DSCA as the target column address CA in response to the first match signal MTH1 (e.g., having a second value). Therefore, when a column address of a bit-line coupled to the at least one fail cell in the memory block MB0 is stored in the address storage table 420 as the source column address SRCA and as fuse information and a column address of a bit-line coupled to the normal cell replacing the fail cell in the memory block MB0 is stored in the address storage table 420 as the destination column address DSCA and as fuse information, the fail cell in the memory block MB0 is repaired, and therefore replaced, with the normal cell in the memory block MB. In addition, the normal cell may be replaced with or reassigned to a redundancy cell in the redundancy block RMB.

In an exemplary embodiment, the selection circuit 440 may be configured as an address converting circuit that performs XOR operation on some upper bits of the access column address CADDR and bits of the destination column address DSCA, in response to the match signal MTH1. For example, when the access column address CADDR includes six bits and the destination column address DSCA includes three bits, the address converting circuit performs XOR operation on upper three bits of the access column address CADDR and three bits of the destination column address DSCA to output the target column address in response to the match signal MTH1 having a logic high level.

Configurations of each of the unit repair controllers 401b, 401c and 401d in FIG. 3 may be substantially the same as the configuration of the first unit repair controller 401a of FIG. 4A.

Figure 4B:
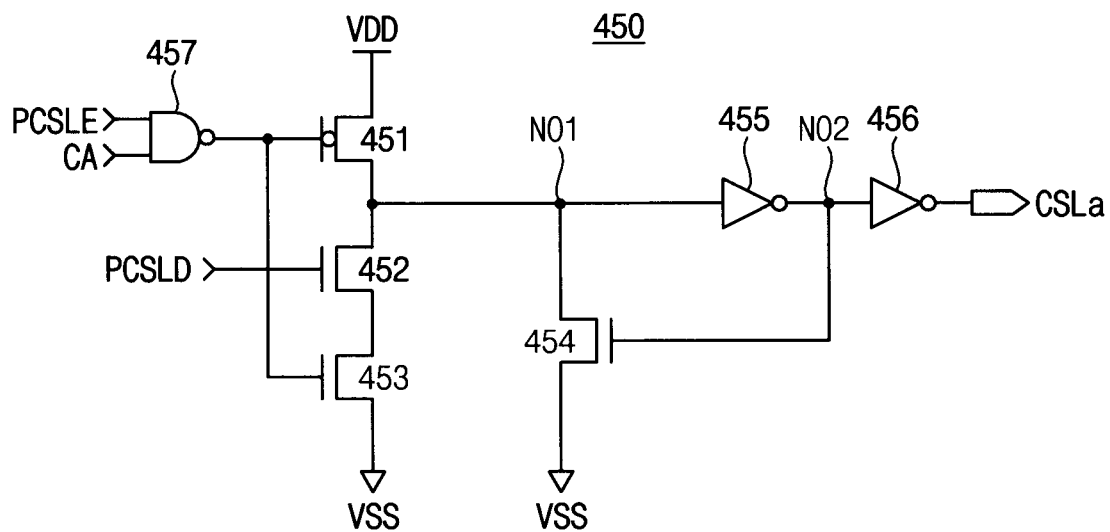
FIG. 4B is a circuit diagram illustrating an example of the column selection line driver in the first unit repair controller in FIG. 4A.

FIG. 4B is a circuit diagram illustrating an example of the column selection line driver in the first unit repair controller in FIG. 4A.

Referring to FIG. 4B, the column selection line driver 450 may include driving transistors 451, 452, 423 and 454, inverters 455 and 456 and a NAND gate 457.

The NAND gate 457 performs a NAND operation on the target column address CA and an enabling master signal PCSLE. The driving transistor 451 has a source coupled to the power supply voltage VDD, a gate receiving an output of the NAND gate 457 and a drain coupled to a first node NO1. The driving transistor 452 includes a drain coupled to the first node NO1, a gate receiving a disabling master signal PCSLD and a source coupled to the driving transistor 453. The driving transistor 453 includes a drain coupled to the driving transistor 452, a gate receiving the output of the NAND gate 457 and a source coupled to a ground voltage VSS.

The inverter 455 inverts a logic level at the first node NO1 to provide its output at a second node NO2 and the inverter 456 inverts a logic level at the second node NO2 to output the column selection line signal CSLa. The driving transistor 454 includes a drain coupled to the first node NO1, a gate coupled to the second node No2 and a source coupled to the ground voltage VSS.

When the target column address CA is applied with a logic high level, and the enabling master signal PCSLE is applied with a logic high level, the output of the NAND gate 457 becomes a logic low level. Therefore, the driving transistor 451 is turned on, and the driving transistor 453 is turned off. Therefore, the first node NO1 becomes a high level, the driving transistor 454 is turned off, and the inverter 456 outputs the column selection line signal CSLa having a high level.

When the target column address CA is applied with a logic low level, and the enabling master signal PCSLE is applied with a logic high level, the output of the NAND gate 457 becomes a logic high level. Therefore, the driving transistor 451 is turned off, and the driving transistors 452 and 453 are turned on. Therefore, the inverter 456 outputs the column selection line signal CSLa having a low level. The enabling master signal PCSLE and the disabling master signal PCSLD may be provided from a pre-decoder in the repair control circuit 400a or a column decoder including the repair control circuit 400a. The pre-decoder may control logic levels of the enabling master signal PCSLE and the disabling master signal PCSLD by referring fuse information associated with the fail cell and fuse information associated with column selection line information stored in a fuse circuit included in the redundancy repair controller 401e. Therefore, the repair control circuit 400a may select the first normal cell instead of the first fail cell and may select the first redundancy cell instead of the first normal cell by controlling the enabling master signal PCSLE and the disabling master signal PCSLD.

Figure 5:
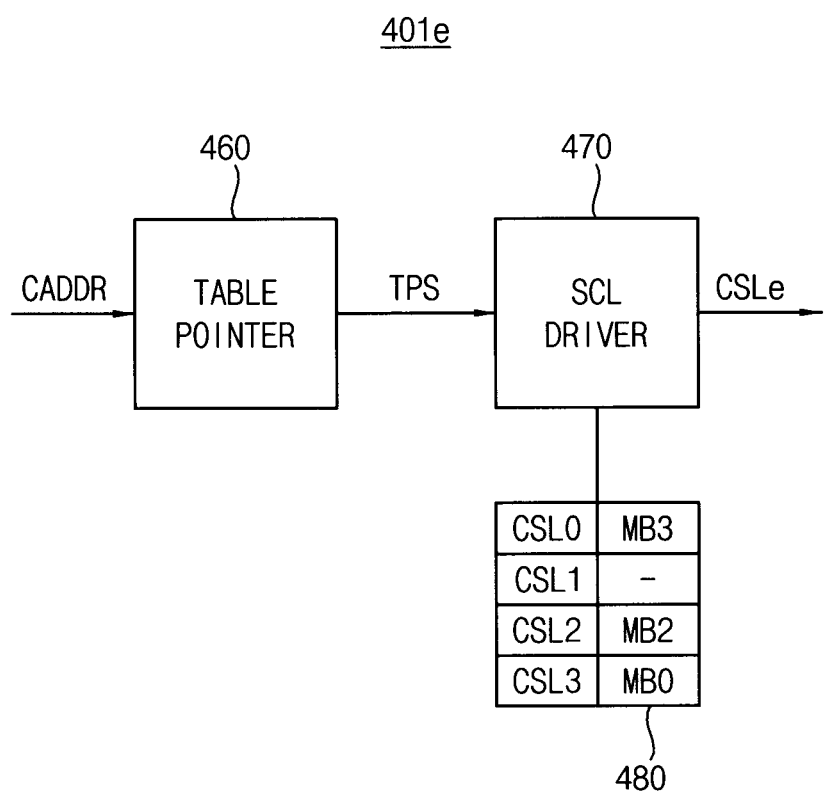
FIG. 5 is a block diagram illustrating an example of the redundancy repair controller in the semiconductor memory device of FIG. 3 according to exemplary embodiments.

FIG. 5 is a block diagram illustrating an example of the redundancy repair controller in the semiconductor memory device of FIG. 3 according to exemplary embodiments.

Referring to FIG. 5, the redundancy repair controller 401e includes a table pointer 460, a fuse circuit 480 and a redundancy column selection line driver 470.

The table pointer 460 generates a table pointing signal TPS toggling in response to the column address CADDR which changes sequentially. The fuse circuit 480 stores column selection line information associated with each of redundancy bit-lines in the redundancy block RMB. The fuse circuit 480 stores information of the memory blocks MB3, MB2 and MB0 which are repaired when the column selection line signals CSL0, CSL2 and CSL3 are enabled respectively.

The redundancy column selection line driver 470 may output the redundancy column selection line signal CSLe to select some of the redundancy bit-lines in response to the table pointing signal TPS and by referring to the column selection line information in the fuse circuit 480.

Therefore, referring to FIGS. 3 through 5, the repair control circuit 400a repairs the first fail cell with the first normal cell in the same memory block and replaces the first normal cell with a first redundancy cell in the redundancy block.

Figure 6A:
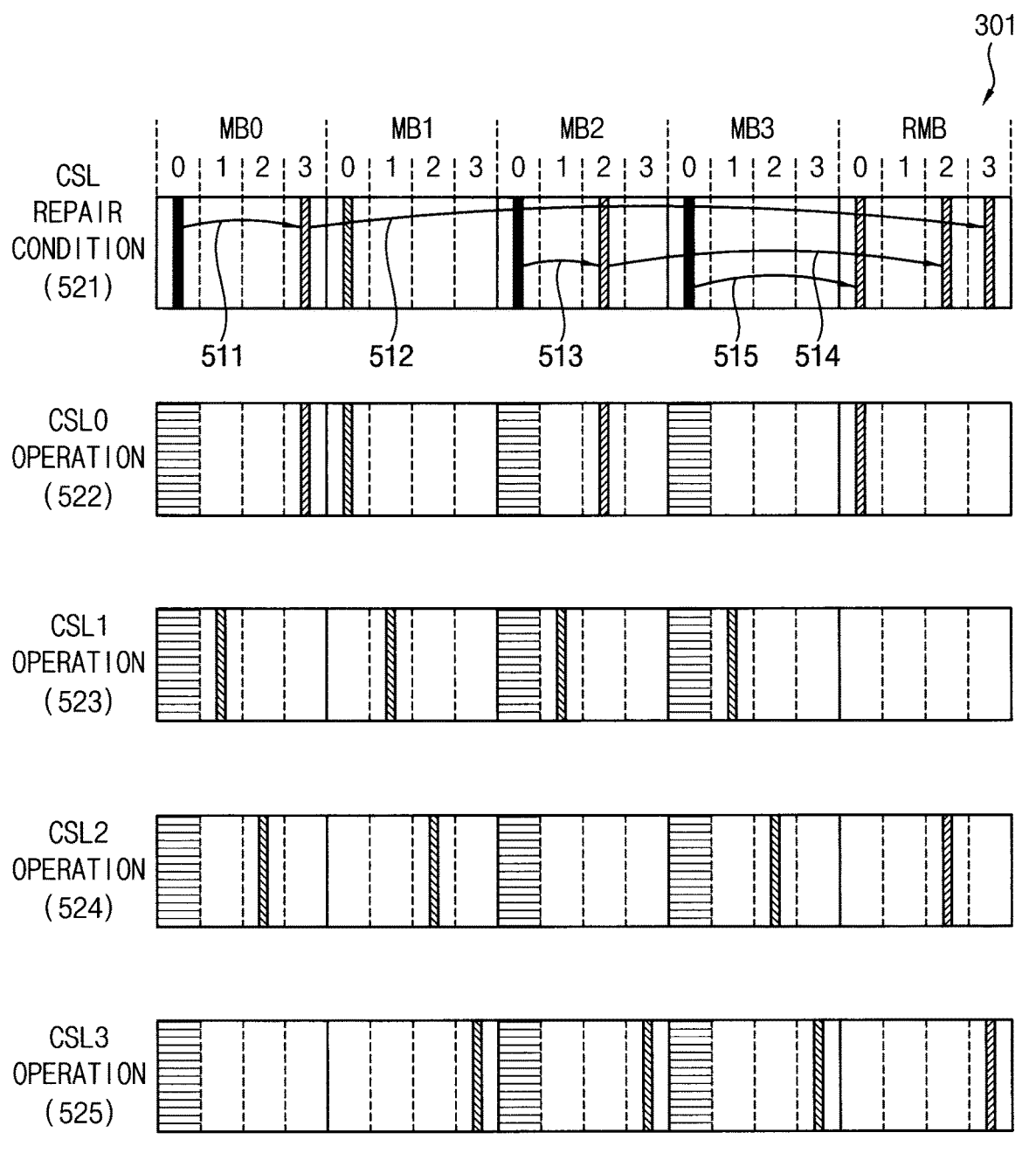
FIG. 6A illustrates a repair operation performed in the semiconductor memory device of FIG. 3.

FIG. 6A illustrates a repair operation performed in the semiconductor memory device of FIG. 3, according to one embodiment.

In FIG. 6A, it is assumed that a repair condition of the memory cell array 301 corresponds to a condition as indicated by a reference numeral 521. The repair condition of the memory cell array 301 may be determined by considering a location of the fail cell in each of the memory blocks MB0~MB3. The repair condition may be determined such that redundancy resources to repair the fail cell or replace the normal cell in the memory blocks MB0, MB2 and MB3 are not overlapped, and burst operation of the semiconductor memory device 200a may be supported.

Referring to FIGS. 3 through 6A, when CSL0 operation 522 in each of the memory blocks MB0~MB3 is designated by the access column address CADDR, the first normal cell corresponding to the CSL3 instead of the fail cell is selected in the memory block MB0 (for example, the column selection transistor 294d instead of the column selection transistor 294d in the memory block MB0 is turned-on), a normal cell corresponding to the CSL0 is selected in the memory block MB1, a normal cell corresponding to CSL2 instead of the fail cell is selected in the memory block MB2, and a redundancy cell corresponding to CSL0 is selected instead of the fail cell in the memory block MB3. During CSL0 operation, a repair operation to repair the fail cell with a corresponding normal cell is performed in each of the memory blocks MB0 and MB2.

When CSL1 operation 523 in each of the memory blocks MB0~MB3 is designated by the access column address CADDR, a normal cell corresponding to CSL1 is selected in each of the memory blocks MB0~MB3. When CSL2 operation 524 in each of the memory blocks MB0~MB3 is designated by the access column address CADDR, a normal cell corresponding to CSL2 is selected in each of the memory blocks MB0, MB1 and MB3 and a redundancy cell corresponding to CSL2 in the redundancy block RMB is selected instead of a normal cell corresponding to CSL2 being selected in the memory block MB2.

When CSL3 operation 525 in each of the memory blocks MB0~MB3 is designated by the access column address CADDR, a normal cell corresponding to CSL3 is selected in each of the memory blocks MB1, MB2 and MB3 and a redundancy cell corresponding to CSL3 in the redundancy block RMB is selected instead of a normal cell corresponding to CSL3 being selected in the memory block MB0. In this manner, and in connection with FIGS. 1-5 above, a repair control circuit is configured to cause a second column of normal memory cells of a first memory block (e.g., the column numbered 3 of MB0) to serve as a destination column for a first column of normal memory cells of the first memory block (e.g., the column numbered 0 of MB0), and to cause a first column of redundancy memory cells of the redundancy memory block (e.g., the column numbered 3 of RMB) to store data destined for the second column of normal memory cells of the first memory block. The first column may be a column of the first memory block that has at least one failed memory cell. For read operations, the repair control circuit may be configured to cause the second column of normal memory cells of the first memory block to serve as a destination read column for the first column of normal memory cells of the first memory block, and to cause the first column of redundancy memory cells of the redundancy memory block to serve as a destination read column for the second column of normal memory cells of the first memory block. For write operations, the repair control circuit reassigns data destined for the first failed column to the second column, and reassigns data destined for the second column to the redundancy block. A similar process may occur in memory block MB2. In this manner, a first memory cell in a first column of the first memory block may be repaired, and therefore replaced, using a normal memory cell in a second column of the first memory block.

As discussed above, a fuse circuit (480) may be part of the repair control circuit and may store a correlation between column select lines of the redundancy block and memory blocks of the plurality of memory blocks. In addition, an address storage table may store source addresses and corresponding destination addresses for the repair control circuit to use when causing the second column of normal memory cells of the first memory block to serve as the destination column for the first column of normal memory cells of the first memory block. The repair control circuit further uses the source addresses and corresponding destination addresses when causing the first column of redundancy memory cells of the redundancy memory block to store data destined for the second column of normal memory cells of the first memory block. As shown in the example of FIG. 6A as well as other examples, the first column of redundancy memory cells of the first redundancy block (e.g., the column numbered 3 of RMB) may have the same relative location within the first redundancy block that the second column of the first memory block (e.g., the column numbered 3 of MB0) has within the first memory block. Similarly, a second column of redundancy memory cells of the first redundancy block (e.g., the column numbered 2 of RMB) may have the same relative location within the first redundancy block that a second column of a second memory block (e.g., the column numbered 2 of MB2, used to repair a fail cell in column 0 of MB2) has within the second memory block. The second column of the first memory block (e.g., column 3 of MB0) may have a different relative location within the first memory block from the second column of the second memory block within the second memory block (e.g., column 2 of MB 2).

Figure 6B:
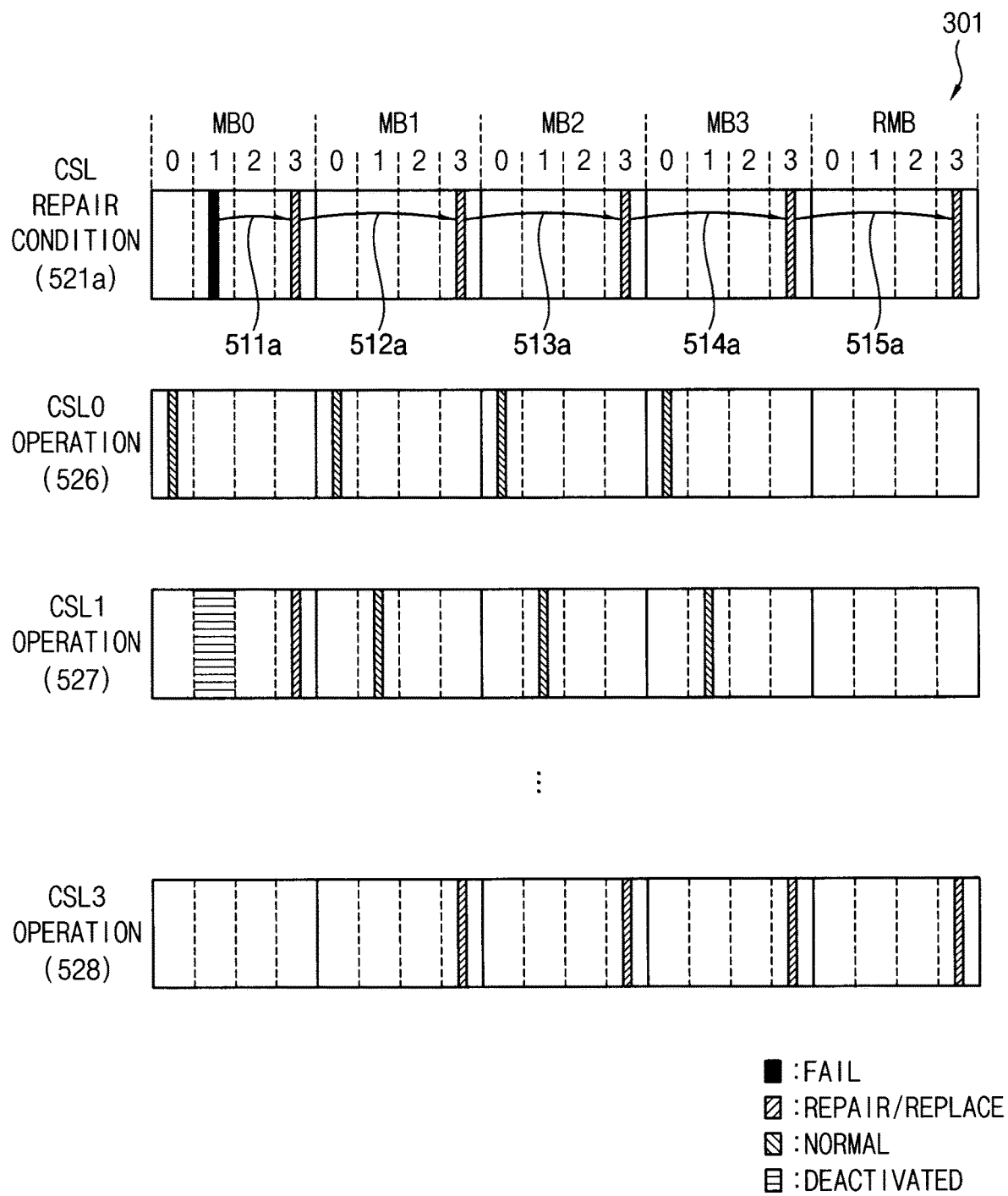
FIG. 6B illustrates a repair operation performed in the semiconductor memory device of FIG. 2B.

FIG. 6B illustrates a repair operation performed in the semiconductor memory device of FIG. 2B.

Referring to FIGS. 2B and 6B, a repair condition 521a of the memory cell array 301 is as follows. The memory block MB0 includes a fail cell associated with a column selection line signal CSL1, and thereby associated with a first column of the memory block MB0, the fail cell in the memory block MB0 is repaired with a first normal cell by enabling a column selection line signal CSL3 associated with a second column of the memory block MB0, instead of the column selection line signal CSL1 as a reference numeral 511a indicates. The first normal cell in the memory block MB0 is replaced with a second normal cell in the memory block MB1 different from the MB0 as a reference numeral 512a indicates, and the second normal cell in the memory block MB1 is replaced with a first redundancy cell in the redundancy block RMB as reference numerals 513a, 514a and 515a indicate. The repair control circuit 400a repairs the first fail cell in the first memory block MB0 with the first normal cell in the first memory block MB0, replaces the first normal cell with the second normal cell in the second memory block MB1 different from the first memory block MB0, replaces the second normal cell with the third normal cell in the third memory block MB2 different from the second memory block MB1, replaces the third normal cell with the fourth normal cell in the fourth memory block MB3 different from the third memory block MB2 and replaces the fourth normal cell with the first redundancy cell in the redundancy block RMB. The first normal cell, the second normal cell, the third normal cell, the fourth normal cell and the first redundancy cell may have a same column selection line address. In this manner, the first normal memory cell (e.g., in the column numbered 3 in memory block MB0) is replaced by using the first redundancy memory cell (e.g., in the column numbered 3 in redundancy block RMB) through a shift operation. For example, the shift operation may include replacing the second normal cell (e.g., in the column numbered 3 of the memory block MB0) with a third normal memory cell in a first column of a second memory block of the memory device (e.g., in the column numbered 3 of the memory block MB1), and then replacing one column of memory cells each memory block other than a final memory block of the plurality of memory blocks with one column of memory cells from an adjacent memory block, and replacing one column in the final memory block of the plurality of memory blocks with a first column of redundancy memory cells of the redundancy block.

When CSL0 operation 526 in each of the memory blocks MB0~MB3 and the redundancy block RMB is designated by the access column address CADDR, a normal cell corresponding to the CSL0 is selected in each of the memory blocks MB0~MB3. When CSL1 operation 527 in each of the memory blocks MB0~MB3 and the redundancy block RMB is designated by the access column address CADDR, the first normal cell corresponding to CSL3 instead of the first fail cell corresponding to CSL1 is selected in the memory block MB0 and a normal cell corresponding to CSL1 is selected in in each of the memory blocks MB1~MB3.

When CSL3 operation 528 in each of the memory blocks MB0~MB3 and the redundancy block RMB is designated by the access column address CADDR, a second normal cell corresponding to CSL3 in the memory block MB1 is selected instead of the first normal cell corresponding to CSL3 in the memory block MB0, a third normal cell corresponding to CSL3 in the memory block MB2 is selected instead of the second normal cell corresponding to CSL3 in the memory block MB1, a fourth normal cell corresponding to CSL3 in the memory block MB3 is selected instead of the third normal cell corresponding to CSL3 in the memory block MB2, and the first redundancy cell corresponding to CSL3 is selected in the redundancy block RMB instead of the fourth normal cell corresponding to CSL3 in the memory block MB3. Therefore, the semiconductor memory device 200a may use redundancy resources in the redundancy block RMB with supporting data input/output having a size corresponding to a burst length.

Figure 6C:
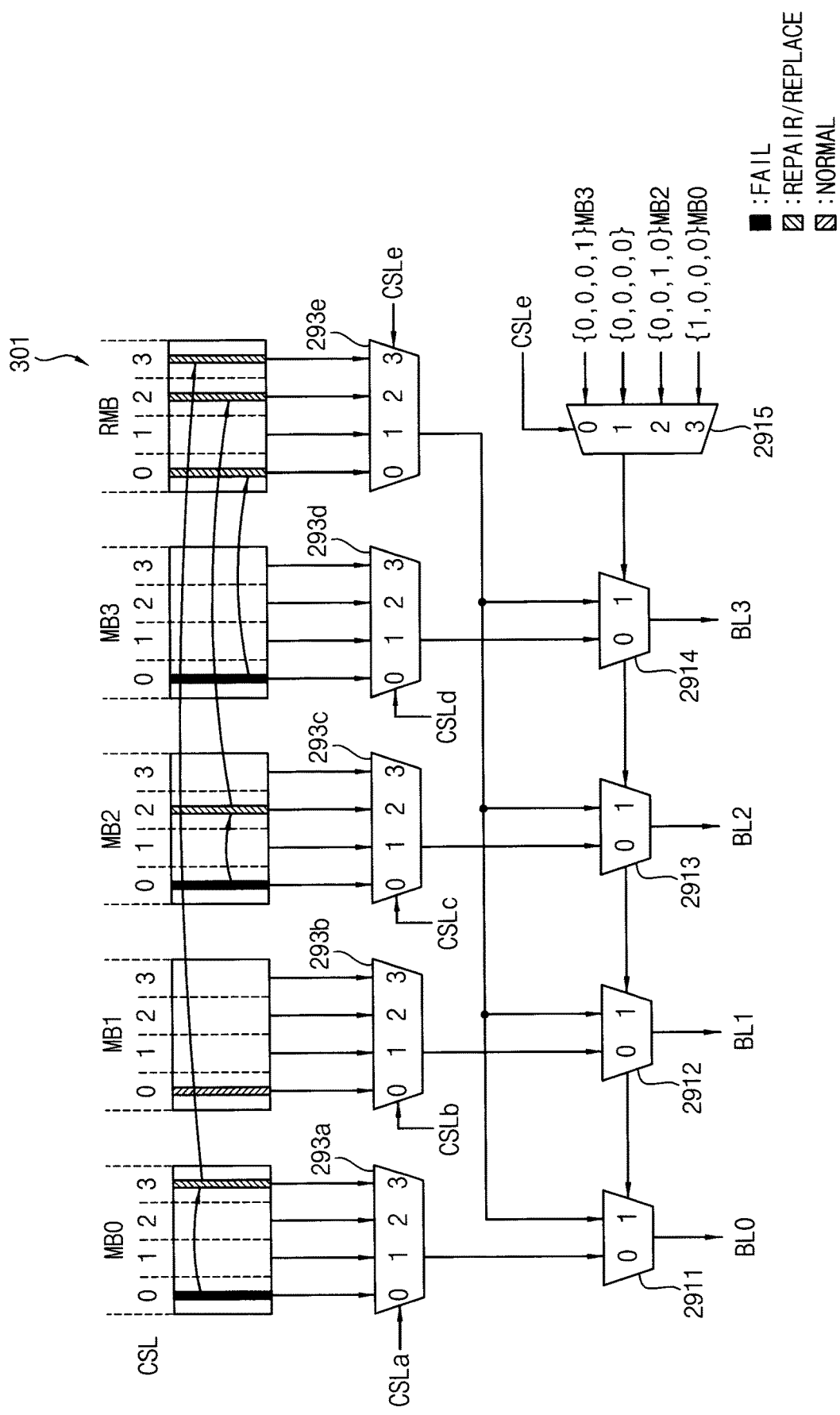
FIG. 6C illustrates data input/out when the repair operation in FIG. 6A is performed.

FIG. 6C illustrates data input/out when the repair operation in FIG. 6A is performed.

Referring to FIG. 6C, when the repair condition the memory cell array 301 corresponds to the condition as indicated by the reference numeral 521, data, which are selected in the memory blocks MB0~MB3 and the redundancy block RMB by column selection circuits 293a~293e and the selection circuits 2911~2915 in the I/O gating circuit 290a, are provided to the data I/O buffer 296 by unit of burst lengths BL0~BL3. That is, the selection circuit 2911 may select output of one of the column selection circuits 293a and 293e, the selection circuit 2912 may select output of one of the column selection circuits 293b and 293e, the selection circuit 2913 may select output of one of the column selection circuits 293c and 293e, and the selection circuit 2914 may select output of one of the column selection circuits 293d and 293e.

In the CSL0 operation, the selection circuit 2911 may select data output from the memory block MB0, the selection circuit 2912 may select data output from the memory block MB1, the selection circuit 2913 may select data output from the memory block MB2, and the selection circuit 2914 may select data output from the redundancy block RMB, in response to a signal {0, 0, 0, 1} from the selection circuit 2915.

Figure 6D:
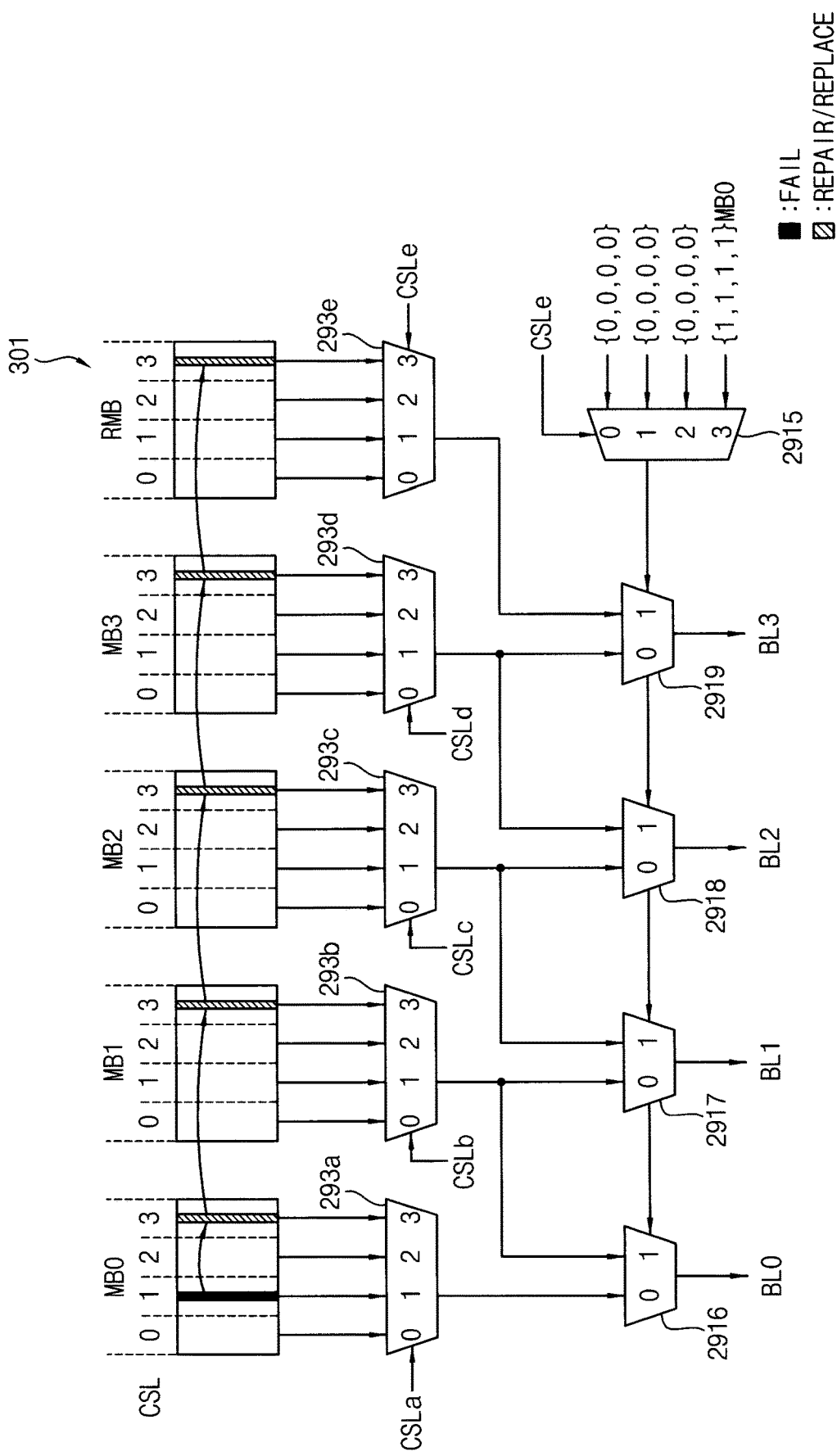
FIG. 6D illustrates data input/out when the repair operation in FIG. 6B is performed.

FIG. 6D illustrates data input/out when the repair operation in FIG. 6B is performed.

Referring to FIG. 6D, when the repair condition the memory cell array 301 corresponds to the condition as indicated by the reference numeral 521a, data, which are selected in the memory blocks MB0~MB3 and the redundancy block RMB by column selection circuits 293a~293e and the selection circuits 2916~2919 and 2915 in the I/O gating circuit 290a, are provided to the data I/O buffer 296 by unit of burst lengths BL0~BL3. That is, the selection circuit 2916 may select output of one of the adjacent column selection circuits 293a and 293b, the selection circuit 2917 may select output of one of the adjacent column selection circuits 293b and 293c, the selection circuit 2918 may select output of one of the adjacent column selection circuits 293c and 293d, and the selection circuit 2919 may select output of one of the adjacent column selection circuits 293d and 293e.

In the CSL4 operation, the selection circuit 2916 may select data output from the memory block MB1, the selection circuit 2917 may select data output from the memory block MB2, the selection circuit 2918 may select data output from the memory block MB3, and the selection circuit 2919 may select data output from the redundancy block RMB, in response to a signal {1, 1, 1, 1} from the selection circuit 2915.

Figure 7:
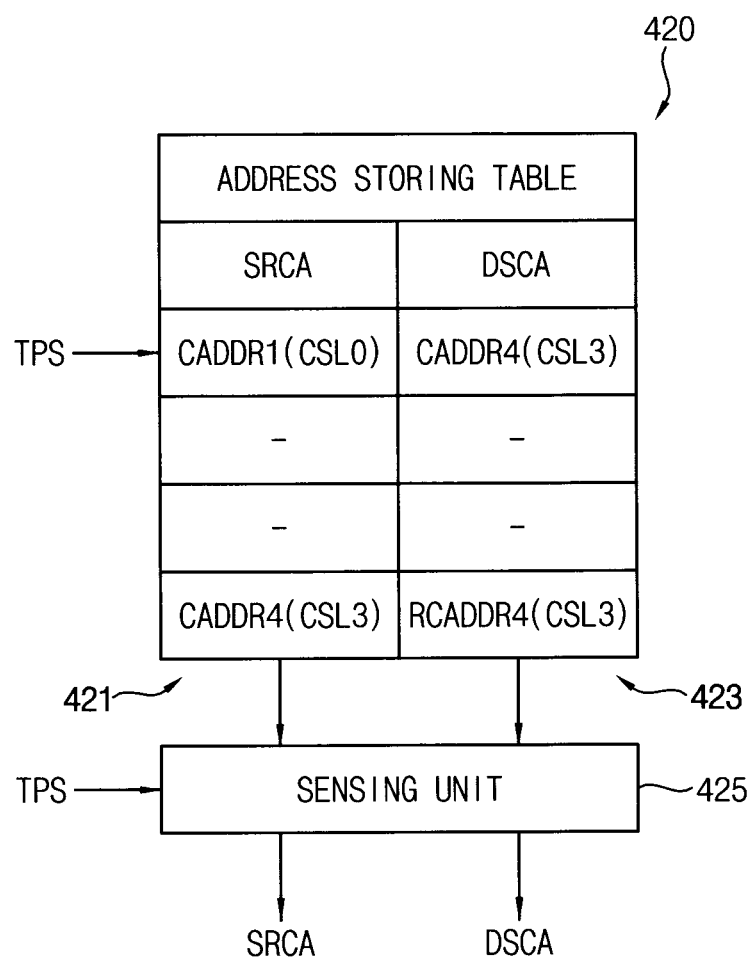
FIG. 7 illustrates an example of the address storage table in the first unit redundancy repair controller in FIG. 4A.

FIG. 7 illustrates an example of the address storage table in the first unit redundancy repair controller in FIG. 4A.

Referring to FIG. 7, the address storage table 420 includes a first storage unit 421, a second storage unit 423 and a sensing unit 425. The first storage unit 421, which may be a circuit, stores the source column address SRCA to be repaired and the second storage unit 423, which may be a circuit, stores the destination column address DSCA to replace the source column address SRCA. The address storage table 420 may be implemented as an anti-fuse array or a content addressable memory (CAM). The sensing unit 425 outputs the source column address SRCA and the destination column address DSCA stored in a location (indicated by the pointer signal TPS) in the first storage unit 421 and the second storage unit 423 in response to on the pointer signal TPS. In FIG. 7, the address storage table 420 stores a column address CADDR1 associated with CSL0 and a column address CADDR4 associated with CSL3 as the source column address SRCA and stores the column address CADDR4 to replace the column address CADDR1 and a redundancy column address RCADDR4 to replace the column address CADDR4 as the destination column address DSCA. In this manner, an address (CADDR1) of a first normal memory cell in a first column of a first memory block is replaced with a destination address that is an address (CADDR4) of a second normal memory cell in a second column of the first memory block, and the address (CADDR4) of the second normal memory cell in the second column of the first memory block is replaced with and reassigned to an address (RCADDR4) of a first redundancy memory cell in a redundancy block of the memory device. It should be noted that in some embodiments, particularly where the redundancy block RMB has the same number of columns of memory cells as the memory blocks MB0~MB3, the address storing table does not need to store the reassignment of the second normal memory cell to the first redundant memory cell. A fuse circuit such as fuse circuit 480 of FIG. 5 may be used to accomplish this reassignment.

Figure 8:
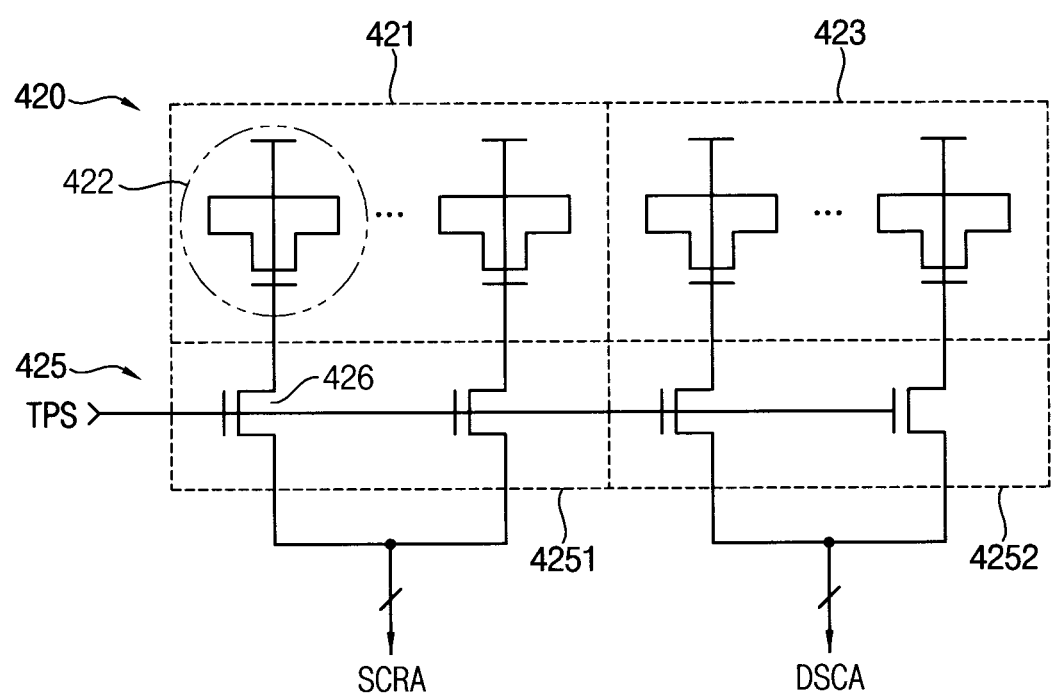
FIG. 8 is a diagram illustrating an example of the address storing table in FIG. 7.

FIG. 8 is a diagram illustrating an example of the address storing table in FIG. 7, according to one exemplary embodiment.

Referring to FIG. 8, the address storing table 420 may be implemented by an anti-fuse array including a plurality of anti-fuses 422. The anti-fuses 422 have electrical characteristics that are opposite to those of fuse elements. The anti-fuses 422 are resistive fuse elements that have a relatively high resistance value when they are not programmed and a relatively low resistance value when they are programmed. The address storing table 420 may store the source column address SRCA and the destination column address DSCA by selectively programming the anti-fuses 422.

The sensing unit 425 includes first and second sub sensing units 4251 and 4252 coupled respectively to the first and second storage units 421 and 423. Each of the first and second sub sensing units 4251 and 4252 may be implemented with an NMOS transistor 426. Therefore, the sensing unit 425 provides the source column address SRCA to the column address comparator 430, and provides the destination column address DSCA to the selection circuit 440, in response to the pointer signal TPS.

Figure 9A:
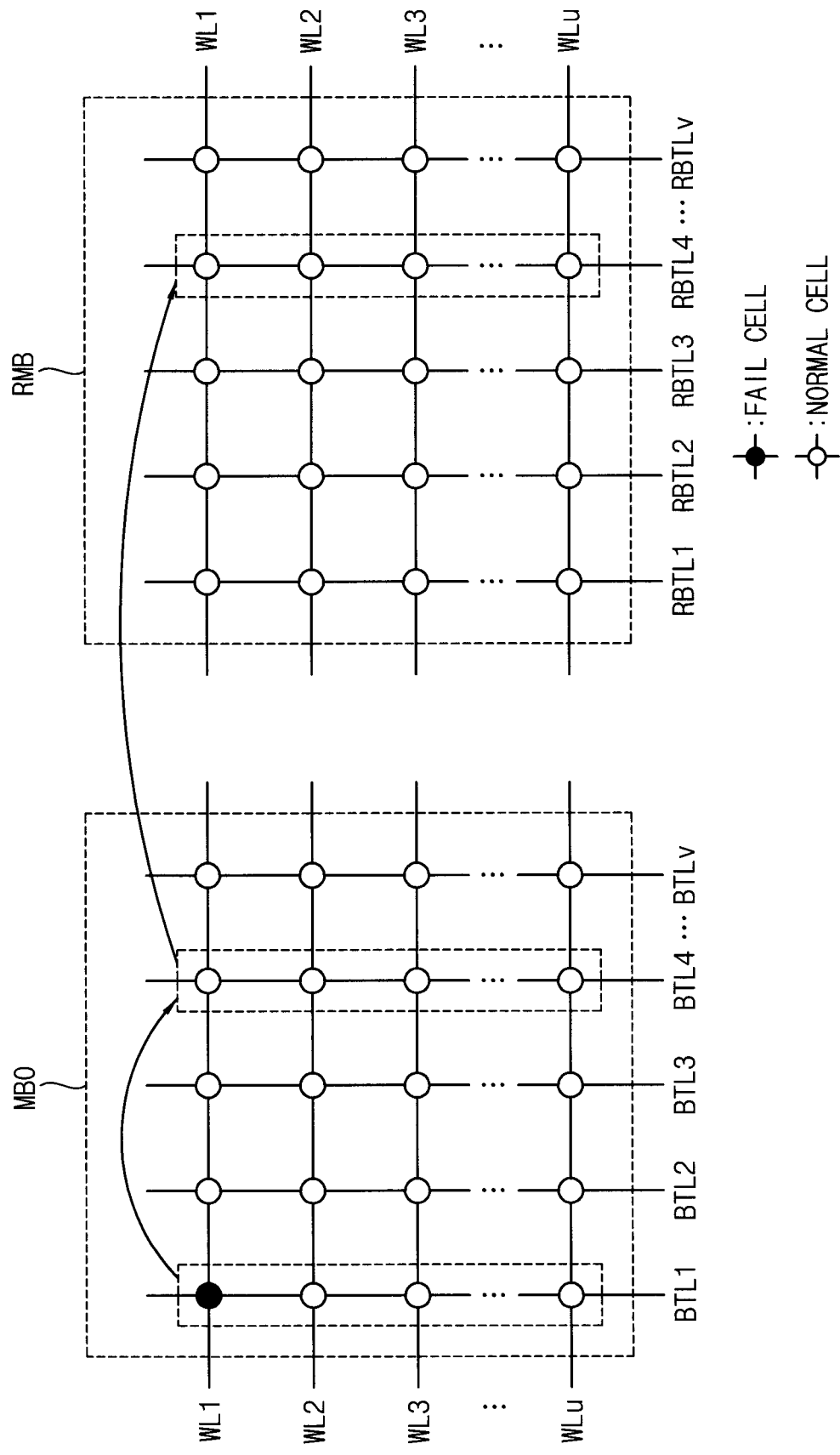

FIGS. 9A to 9C are diagrams for describing methods of replacing a fail cell with a normal cell in the same memory block and replacing the normal cell with a redundancy cell.

In FIGS. 9A to 9C, the memory block MB0 includes memory cells coupled to word-lines WL1~WLu and bit-lines BTL1~BTLv and the redundancy block RMB includes redundancy cells coupled to the word-lines WL1~WLu and redundancy bit-lines RBTL1~RBTLv. In some embodiments, the number of redundancy bit-lines in the redundancy block RMB is the same as the number of bit-lines in each of the normal memory blocks, such as MB0. In other embodiments, however, the number of redundancy bit-lines in the redundancy block RMB may be smaller than or larger than the number of bit-lines in each of the normal memory blocks.

FIG. 9A is a diagram for describing replacement between bit-lines. For example, when a fault occurs in a memory cell coupled to the word-line WL1 and the bit-line BTL1, the bit-line BTL1 is replaced with the bit-line BTL4 and the bit-line BTL4 may be replaced with the redundancy bit-line RBTL4.

FIG. 9B is a diagram for describing replacement between portions of bit-lines (e.g., segments of bit-lines). A single bit-line may be divided into two or more segments, each segment being connected to at least one memory cell. For example, when a fault occurs in a memory cell coupled to the word-line WL1 and the bit-line BTL1, a segment in the bit-line BTL1 is replaced with a segment in the bit-line BTL4 and the segment in the bit-line BTL4 is replaced with a segment in the redundancy bit-line RBTL4.

FIG. 9C is a diagram for describing replacement between memory cells. For example, when a fault occurs in a memory cell coupled to the word-line WL1 and the bit-line BTL1, the memory cell having the fault is replaced with a memory cell coupled to the bit-line BTL4 and the memory cell coupled to the bit-line BTL4 is replaced with a redundancy cell coupled to the redundancy bit-line RBTL4.

Figure 10:
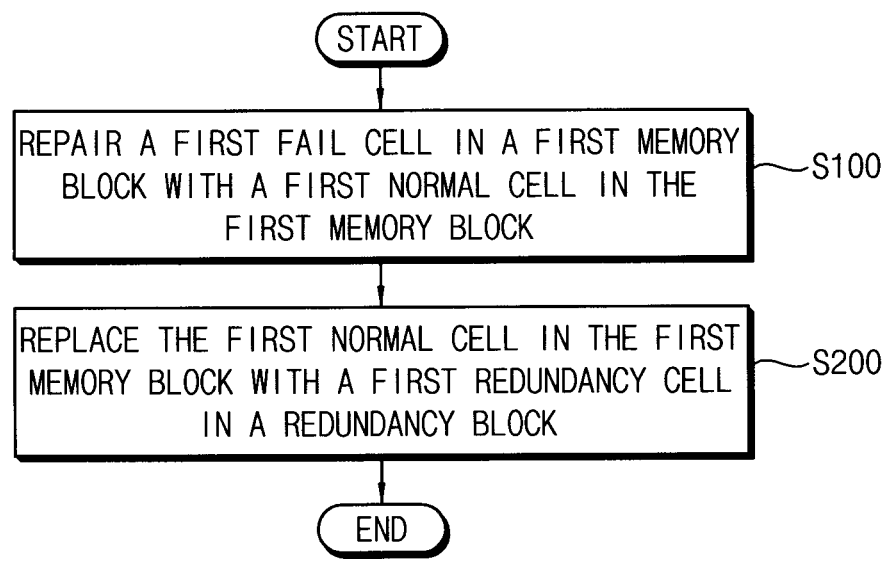
FIG. 10 is a flow chart illustrating a method of operating a semiconductor memory device according to exemplary embodiments.

FIG. 10 is a flow chart illustrating a method of operating a semiconductor memory device according to exemplary embodiments.

Referring to FIGS. 2A to 10, in a method of operating a semiconductor memory device including a memory cell array that includes a plurality of memory blocks and at least one redundancy block, the repair control circuit 400*a* repairs a first fail cell in a first memory block of the plurality of memory blocks with a first normal cell in the first memory block (S100). Before repairing the first fail cell in the first memory block with the first normal cell in the first memory block, the repair control circuit 400*a* may determine whether an access column address matches a first column address designating a first bit-line coupled to the first fail cell. When the access column address matches with the first column address (source column address), the repair control circuit 400*a* performs the repair operation.

The first fail cell in the first memory block and the first normal cell in the first memory block may have different column selection line addresses. For example, the first fail cell and the first normal cell in the first memory block are coupled to different bit-lines selected by different column selection line (CSL) signals. The first fail cell and the first normal cell in the first memory block may be connected to a same I/O circuit. The repair control circuit 400*a* replaces the first normal cell in the first memory block with a first redundancy cell in the redundancy block (S200). The first normal cell and the first redundancy cell may have a same column selection line address. The first normal cell and the first redundancy cell may be connected to different I/O circuits, respectively.

Figure 11:
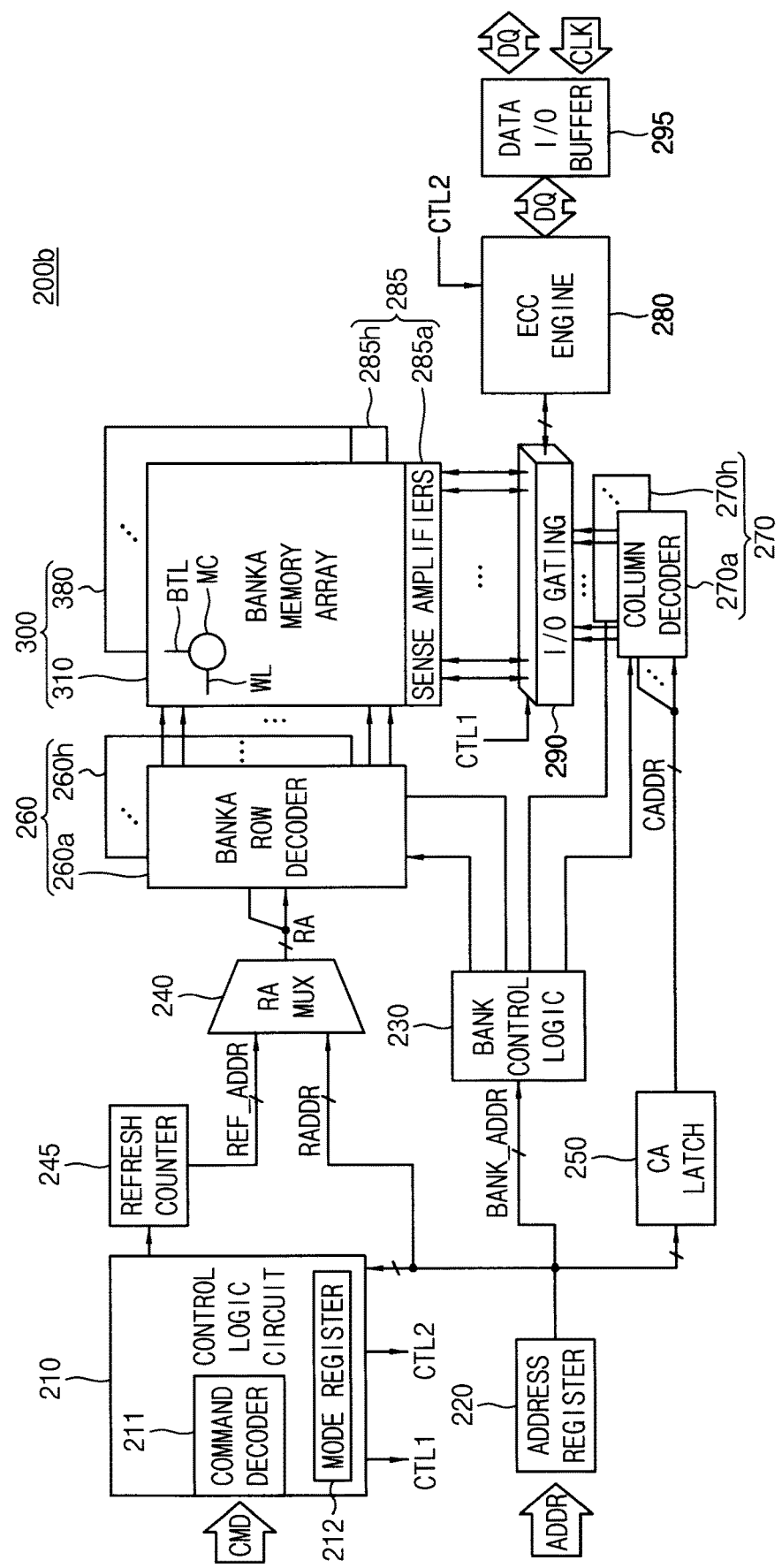
FIG. 11 is a block diagram illustrating another example of the semiconductor memory device in the memory system of FIG. 1 according to exemplary embodiments.

FIG. 11 is a block diagram illustrating another example of the semiconductor memory device in the memory system of FIG. 1 according to exemplary embodiments.

Referring to FIG. 11, a semiconductor memory device 200*b* includes a control logic circuit 210, an address register 220, a bank control logic 230, a refresh counter 245, a row address multiplexer 240, a column address latch 250, a row decoder 260, a column decoder 270, a memory cell array 300, a sense amplifier unit 285, an I/O gating circuit 290, and a data I/O buffer 295.

In an exemplary embodiment, the semiconductor memory device 200*b* may include an error correction code (ECC) engine 280.

The control logic circuit 210, the repair control circuit 400 and the timing control circuit 500 may constitute an access control circuit 205.

The memory cell array 300 includes first through eighth bank arrays 310~380. The row decoder 260 includes first through eighth bank row decoders 260*a*~260*h* respectively coupled to the first through eighth bank arrays 310~380, the column decoder 270 includes first through eighth bank column decoders 270*a*~270*h* respectively coupled to the first through eighth bank arrays 310~380, and the sense amplifier unit 285 includes first through eighth bank sense amplifiers 285*a*~285*h* respectively coupled to the first through eighth bank arrays 310~380. The first through eighth bank arrays 310~380, the first through eighth bank row decoders 260*a*~260*h*, the first through eighth bank column decoders 270*a*~270*h* and first through eighth bank sense amplifiers 285*a*~285*h* may form first through eighth banks. Each of the first through eighth bank arrays 310~380 includes a plurality of memory cells MC formed at intersections of a plurality of word-lines WL and a plurality of bit-lines BTL The address register 220 receives an address ADDR including a bank address BANK_ADDR, a row address RADDR and a column address CADDR from the memory controller 100. The address register 220 provides the received bank address BANK_ADDR to the bank control logic 230, provides the received row address RADDR to the row address multiplexer 240, and provides the received column address CADDR to the column address latch 250.

The bank control logic 230 generates bank control signals in response to the bank address BANK_ADDR. One of the first through eighth bank row decoders 260a~260h corresponding to the bank address BANK_ADDR is activated in response to the bank control signals, and one of the first through eighth bank column decoders 270a~270h corresponding to the bank address BANK_ADDR is activated in response to the bank control signals.

The row address multiplexer 240 receives the row address RADDR from the address register 220, and receives a refresh row address REF_ADDR from the refresh counter 245. The row address multiplexer 240 selectively outputs the row address RADDR or the refresh row address REF_ADDR as a row address RA. The row address RA that is output from the row address multiplexer 240 is applied to the first through eighth bank row decoders 260a~260h.

The activated one of the first through eighth bank row decoders 260a~260h, by the bank control logic 230, decodes the row address RA that is output from the row address multiplexer 240, and activates a word-line corresponding to the row address RA. For example, the activated bank row decoder applies a word-line driving voltage to the word-line corresponding to the row address RA. In addition, the activated bank row decoder activates a spare word-line corresponding to the spare row address SRA output from the repair control circuit 400 simultaneously with activating the word-line corresponding to the row address RA.

The column address latch 250 receives the column address CADDR from the address register 220, and temporarily stores the received column address CADDR. In some embodiments, in a burst mode, the column address latch 250 generates column addresses that increment from the received column address CADDR. The column address latch 250 applies the temporarily stored or generated column address to the first through eighth bank column decoders 270a~270h.

The activated one of the first through eighth bank column decoders 270a~270h activates a sense amplifier corresponding to the bank address BANK_ADDR and the column address CADDR through the I/O gating circuit 290. Each of the first through eighth bank column decoders 270a~270h may include a repair control circuit, and the repair control circuit included in the activated one of the first through eighth bank column decoders 270a~270h may repair a fail cell in at least one memory block of a corresponding bank array with a first normal cell in the same memory block and may replace the first normal cell with a first redundancy cell in a redundancy block in the corresponding bank array.

The I/O gating circuit 290 includes a circuitry for gating input/output data, and further includes read data latches for storing data that is output from the first through eighth bank arrays 310~380, and write drivers for writing data to the first through eighth bank arrays 310~380.

Data read from one bank array of the first through eighth bank arrays 310~380 is sensed by a sense amplifier coupled to the one bank array from which the data is to be read, and is stored in the read data latches. The data stored in the read data latches may be provided to the memory controller 100 via the data I/O buffer 295. The data to be written in one bank array of the first through eighth bank arrays 310~380 may be written in one bank array by the write drivers.

When the semiconductor memory device 200b includes the ECC engine 280, the ECC engine 280 may perform an ECC encoding on data to be written to provide a codeword to the I/O gating circuit 290 and may perform an ECC decoding on a read codeword to provide corrected data to the data I/O buffer 295.

The data I/O buffer 295 may provide the data DQ from the memory controller 100 to the ECC engine 280 in a write operation of the semiconductor memory device 200b, based on the clock signal CLK and may provide the data DQ from the ECC engine 280 to the memory controller 100 in a read operation of the semiconductor memory device 200b.

The control logic circuit 210 may control operations of the semiconductor memory device 200. For example, the control logic circuit 210 may generate control signals for the semiconductor memory device 200b in order to perform a write operation or a read operation. The control logic circuit 210 includes a command decoder 211 that decodes a command CMD received from the memory controller 100 and a mode register 212 that sets an operation mode of the semiconductor memory device 200b.

For example, the command decoder 211 may generate control signals corresponding to the command CMD by decoding a write enable signal, a row address strobe signal, a column address strobe signal, a chip select signal, etc. The control logic circuit 210 provides a first control signal CTL1 to the I/O gating circuit 290 and provides a second control signal CTL2 to the ECC engine 280.

Figure 12:
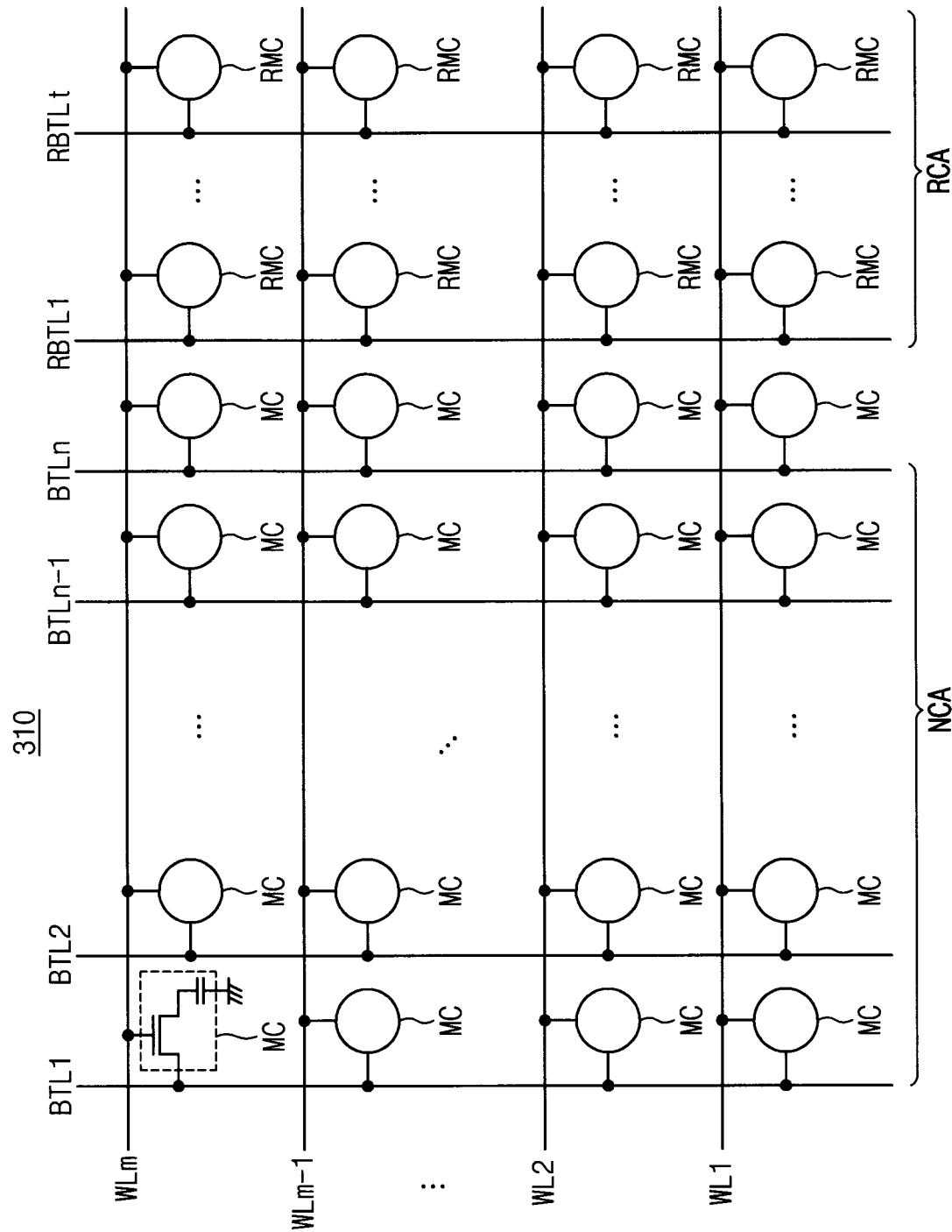
FIG. 12 illustrates an example of the first bank array in the semiconductor memory device of FIG. 11.

FIG. 12 illustrates an example of the first bank array in the semiconductor memory device of FIG. 11.

Referring to FIG. 12, the first bank array 310 includes a normal cell array NCA and a redundancy cell array RCA. The normal cell array NCA includes a plurality of word-lines WL1~WLm (m is a natural number greater than two), a plurality of bit-lines BL1~BLn (n is a natural number greater than two), and a plurality of memory cells MCs disposed at intersections between the word-lines WL1~WLm and the bit-lines BL1~BLn. The redundancy cell array RCA includes a plurality of redundancy cells RMCs disposed at intersections between the word-lines WL1~WLm and a plurality of redundancy bit-lines RBTL1~RBTLt.

Figure 13:
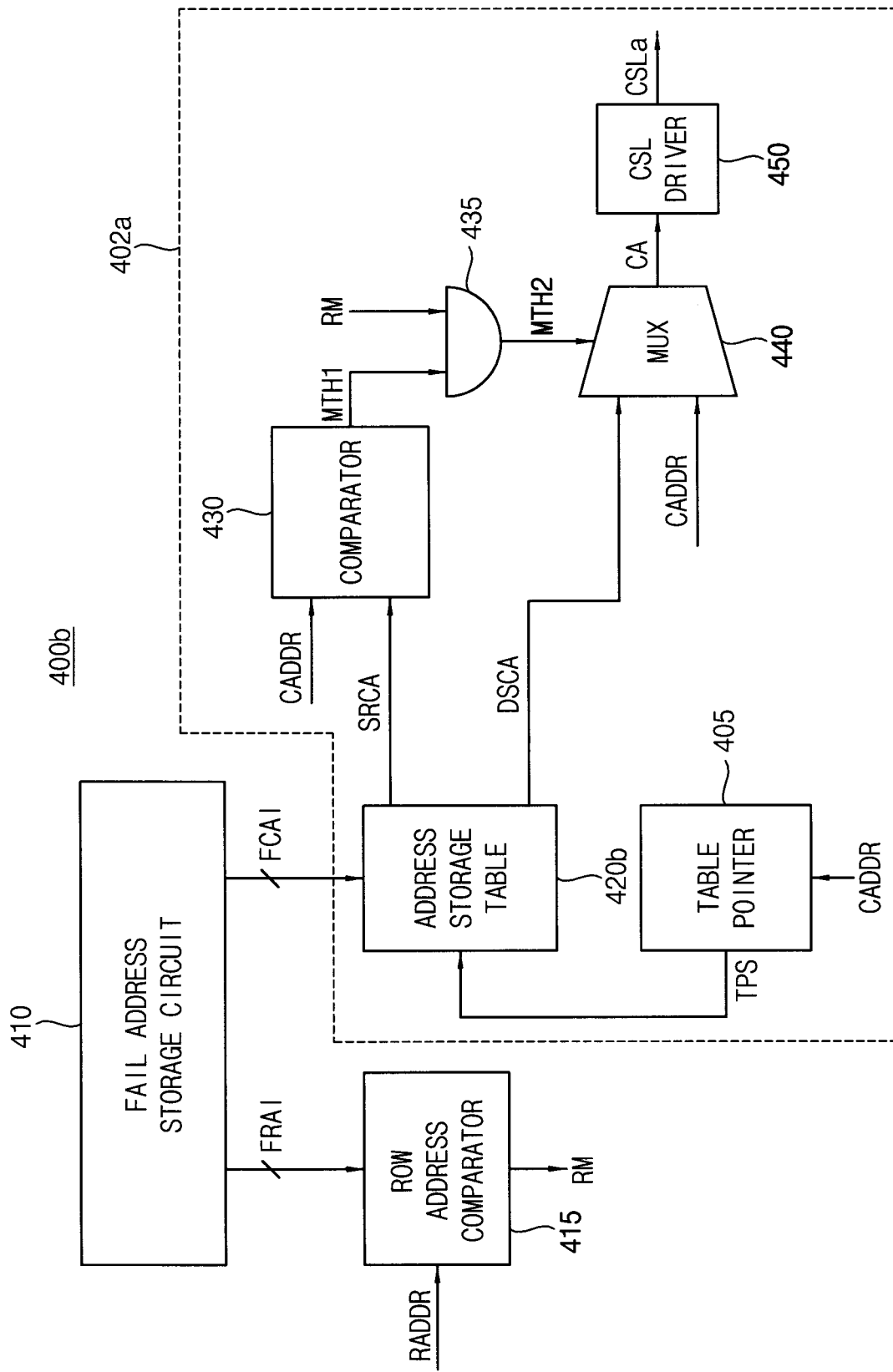
FIG. 13 is a block diagram illustrating a repair control circuit included in each of the bank column decoders in the semiconductor memory device of FIG. 12 according to exemplary embodiments.

FIG. 13 is a block diagram illustrating a repair control circuit included in each of the bank column decoders in the semiconductor memory device of FIG. 12 according to exemplary embodiments.

Referring to FIG. 13, a repair control circuit 400b may include a fail address storage circuit 410, a row address comparator 415 and a unit repair controller 402a.

Figure 15:
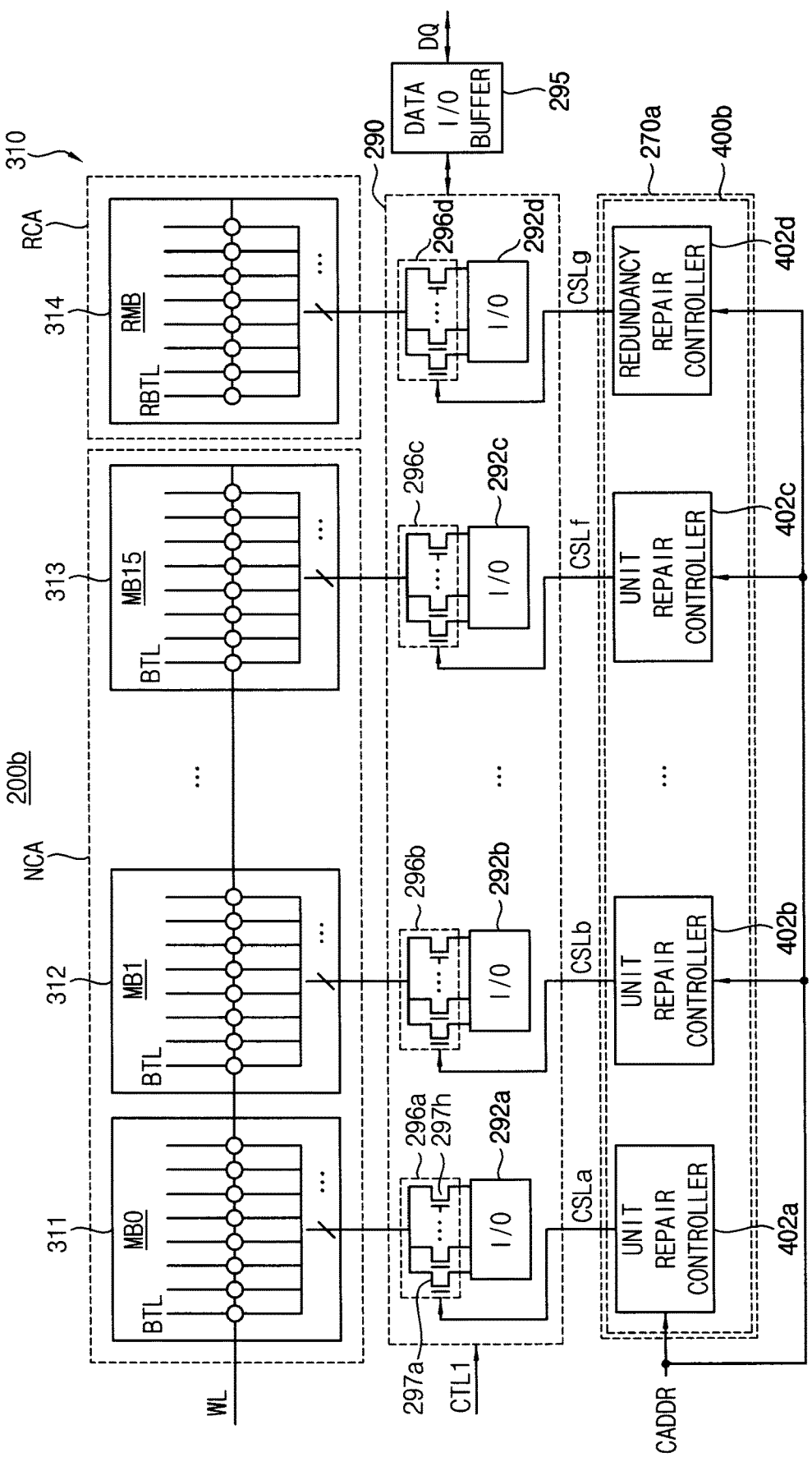
FIG. 15 illustrates a portion of the semiconductor memory device of FIG. 11 according to exemplary embodiments.

Although the repair control circuit 400b is illustrated to include the unit repair controller 402a, the repair control circuit 400b may include a plurality of unit repair controllers and a redundancy repair controller as illustrated in FIG. 15.

The fail address storage circuit 410 stores row address information FRAI and column address information FCAI of at least one defective cell (i.e., fail cell) occurring in the normal cell array of the memory cell array 300. The fail address storage circuit 410 includes non-volatile memory devices to store the location information of the at least one defective cell. For example, the fail address storage circuit 410 may include anti-fuses to store the location information of the at least one defective cell. The location information of the at least one defective cell stored in the fail address storage circuit 410 may be updated.

For example, location information of defective cells that occur in the normal cell array, caused when the semiconductor memory device 200b is continuously used, may be updated in the fail address storage circuit 410. In addition, location information of additional defective cells occurring after the semiconductor memory device 200b is packaged may be updated in the fail address storage circuit 410. Such location information of defective cells may be obtained by testing whether a fail bit occurs in the semiconductor memory device 200b. The test may be performed before the semiconductor memory device 200b is packaged, i.e., at a wafer level, or may be performed after the semiconductor memory device 200b is packaged. A post-package repair (PPR) may be performed using the repair control circuit 400 according to exemplary embodiments.

The location information of the at least one fail cell may be the row address information FRAI and the column address information FCAI of the at least one defective cell.

The row address comparator 415 stores the row address information FRAI received from the fail address storage circuit 410. The row address comparator 420 may receive the row address information FRAI from the fail address storage circuit 410 simultaneously when the semiconductor memory device 200b is driven or a desired time period after the semiconductor memory device 200b is driven. The row address comparator 415 receives the row address RADDR of the access address ADDR, compares the row address RADDR with the row address information FRAI, and outputs a row match signal RM when the row address RADDR matches the row address information FRAI.

The unit repair controller 402a may include a table pointer 405, an address storage table 420b, a column address comparator 430, an AND gate 435, a selection circuit 440 and a column selection line driver 450.

The address storage table 420b may sequentially store column address information FCAI of fail cells and column address information of first normal cells to repair the fail cells as the source column address SRCA and may sequentially store the column address information of the first normal cells and column address information of second normal cells to repair the first normal cells as the destination column address DSCA. The table pointer 405 may generate, to the address storage table 420b, a table pointing signal TPS toggling in response to the access column address CADDR that sequentially changes. The address storage table 420b may output the source column address SRCA and the destination column address DSCA corresponding to the source column address SRCA in response to the table pointing signal TPS.

The column address comparator 430 compares the access column address CADDR with the source column address SRCA from the address storage table 420b and outputs a first match signal MTH1 indicating a result of the comparison. The AND gate 435 performs an AND operation on the row match signal RM and the first match signal MTH1 to output a second match signal MTH2. The selection circuit 440 may select one of the destination column address DSCA from the address storage table 420 and the access column address CADDR in response to the second match signal MTH2 to output a selected one as a target column address CA. The column selection line driver 450 may output the column selection line signal CSLa for selecting (enabling) a bit-line corresponding to the target column address CA.

For example, when the row match signal RM is a low level or when the access column address CADDR does not match the source column address SRCA, the selection circuit 440 may output the access column address CADDR as the target column address CA in response to the second match signal MTH2. For example, when the row match signal RM is a high level and when the access column address CADDR matches the source column address SRCA, the selection circuit 440 may output the destination column address DSCA as the target column address CA in response to the second match signal MTH2.

Figure 14:
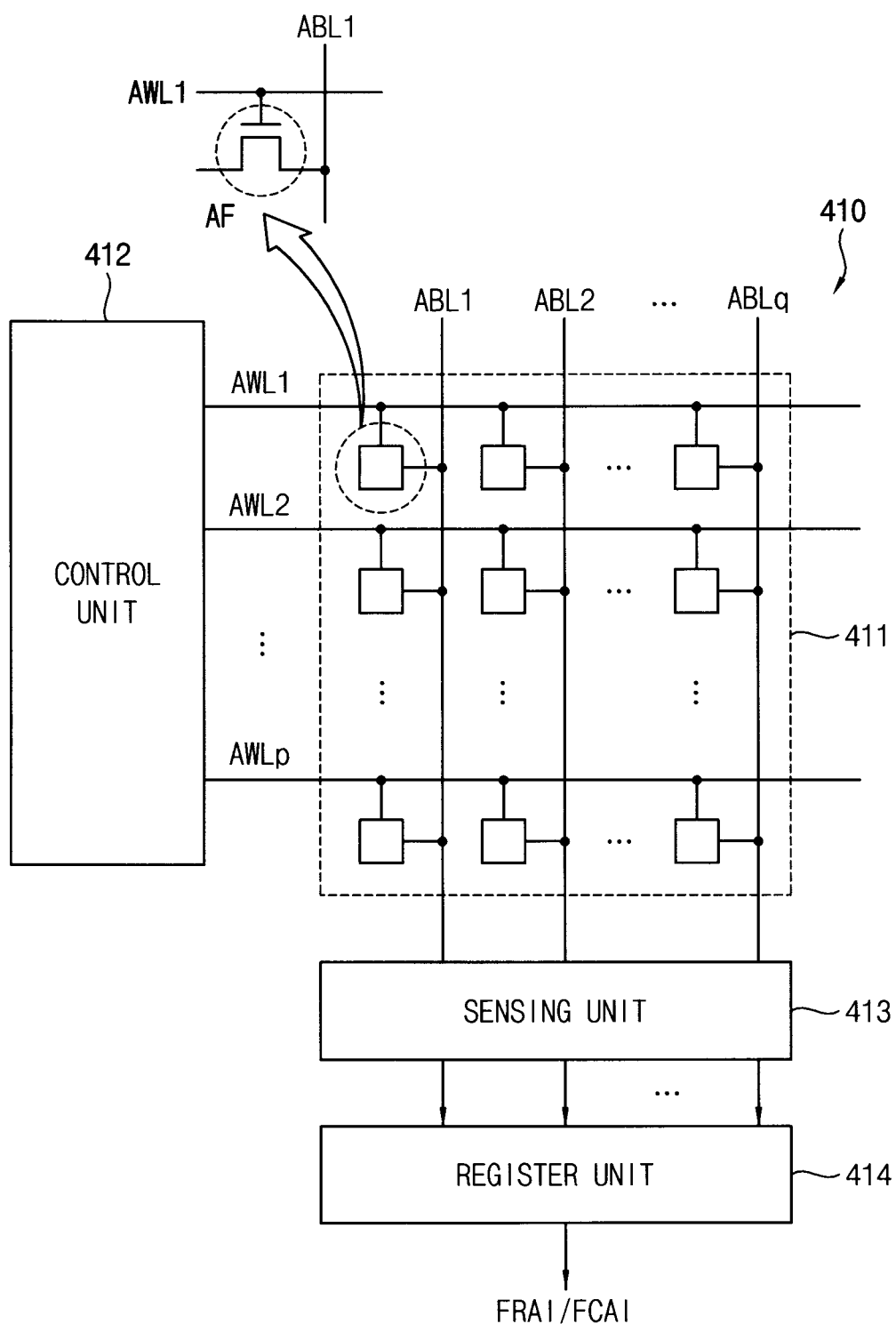
FIG. 14 illustrates an example of the fail address storage table in the repair control circuit of FIG. 13 according to exemplary embodiments.

FIG. 14 illustrates an example of the fail address storage table in the repair control circuit of FIG. 13.

Referring to FIG. 14, the fail address storing table 410 includes anti-fuse array 411, a control unit 412, a sensing unit 413 and a register unit 414.

The anti-fuse array 411 includes p*q anti-fuses (AFs) which are respectively connected to intersections of p rows and q columns. The anti-fuse array 411 includes p word-lines AWL1 to AWLp for accessing anti-fuses (AFs) disposed at the p rows, and q bit-lines ABL1 to ABLq disposed to correspond to q columns so as to deliver information read from the anti-fuses (AFs).

The control unit 412 programs the location information of fail cells in the anti-fuse array 411 or reads the location information of fail cells from the anti-fuse array 412. The sensing unit 413 may sense and amplify the location information of fail cells received from the anti-fuse array 411 and output a result of the amplifying. The register unit 414 may temporarily store the location information of fail cells received from the sensing unit 413. The register unit 414 outputs the row address information FRAI and column address information FCAI of the fail cells, to the row address comparator 420 and the address storage table 420b, respectively.

FIG. 15 illustrates a portion of the semiconductor memory device of FIG. 11.

In FIG. 15, the first bank array 310, the I/O gating circuit 290, the column decoder 270a and the data I/O buffer are illustrated.

Referring to FIG. 15, the first bank array 310 includes a normal cell array NCA and a redundancy cell array RCA. The normal cell array NCA includes a plurality of memory blocks MB0~MB15, i.e., 311~313, and the redundancy cell array RCA includes at least one redundancy block 314. The memory blocks 311~313 are memory blocks determining a memory capacity of the semiconductor memory device 200b. The redundancy block 314 is for redundancy repair.

In each of the memory blocks 311~313, a plurality of memory cells are arranged in rows and columns. In the redundancy block 314, a plurality of redundancy cells are arranged in rows and columns.

The gating circuit 290 includes a plurality of I/O circuits 292a~292d and a plurality of column selection circuits 296a~296d and the column selection circuits 296a~296d may connect one of the I/O circuits 292a~292d to respective one of the memory blocks 311, 312 and 313 and the redundancy block 314. Each of the column selection circuits 296a~296d may include a plurality of column selection transistors 297a~297h, and the plurality of column selection transistors 297a~297h connect a plurality of bit-lines or a bit-line in a corresponding memory block or in the redundancy block 314 to a corresponding I/O circuit in response to column selection line signals CSLa~CSLg respectively. The plurality of I/O circuits 291a~291e may be coupled to the data I/O buffer 296 through data lines (not illustrated) in response to the first control signal CTL1 from the control logic circuit 210. For example, when a column selection line signal applied to the column selection transistor 297a, a bit-line or bit-lines coupled to the column selection transistor 297a in each of the memory blocks 311~313 and the redundancy block may be simultaneously selected. When a column selection line signal applied to the column selection transistor 297h, a bit-line or bit-lines coupled to the column selection transistor 297h in each of the memory blocks 311~313 and the redundancy block may be simultaneously selected.

The column decoder 270a may include a pre-decoder (not illustrated), a plurality of unit repair controllers 402a~402c and a redundancy repair controller 402d. The pre-decoder may decode the access column address CADDR to commonly provide a decoded column address to the plurality of unit repair controllers 402a~402c and the redundancy repair controller 402d.

The unit repair controllers 402a~402c and the redundancy repair controller 402d may commonly receive the access column address CADDR or the decoded column address and may provide the corresponding column selection circuits 296a~296d with the column selection line signals CSLa~CSLg applied to the memory blocks 311~313 and the redundancy block 314.

The repair control circuit 400b repairs at least one fail cell in at least one of the memory blocks 311~313 with a first normal cell in the same memory block, replaces the first normal cell with a second normal cell in the same memory block and replaces the second normal cell with a first redundancy cell in the redundancy block 314. Therefore, the repair control circuit 400b may use redundancy resources in the redundancy block 314 with a substantial maximum efficiency.

Figure 16A:
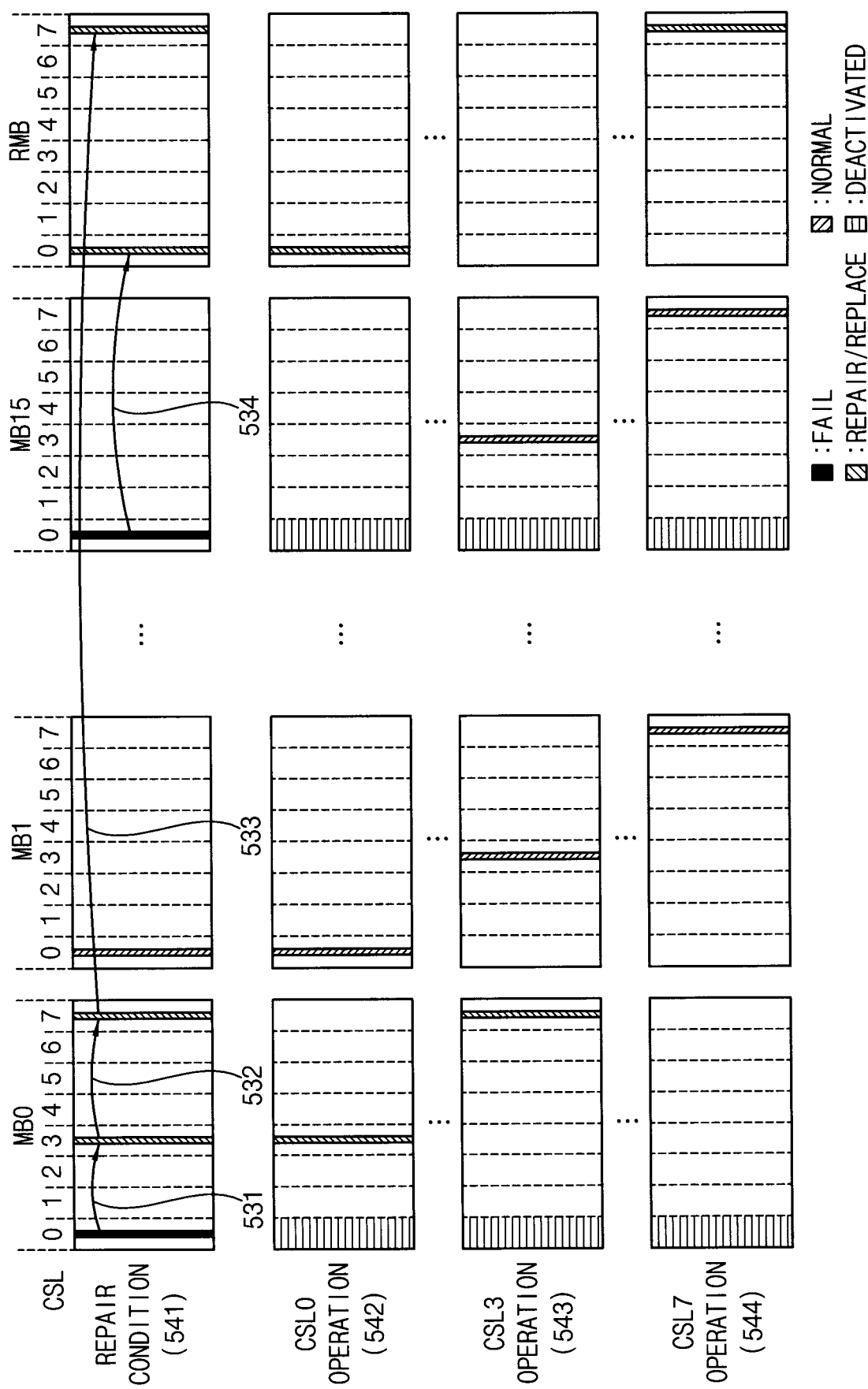
FIG. 16A illustrates a repair operation performed in the semiconductor memory device of FIG. 15 according to exemplary embodiments.

FIG. 16A illustrates a repair operation performed in the semiconductor memory device of FIG. 15.

Referring to FIG. 16A, a repair condition 541 of the first bank array 310 is as follows. Each of the memory blocks MB0 and MB15 includes a fail cell on a bit-line selected by a column selection line signal CSL0. The fail cell in the memory block MB0 is repaired by a first normal cell in the memory block MB0 by enabling a column selection line signal CSL3 instead of the column selection line signal CSL0 as a reference numeral 531 indicates, replaces the first normal cell in the memory block MB0 by enabling a column selection line signal CSL7 instead of the column selection line signal CSL3 as a reference numeral 532 indicates, and replaces the second normal cell in the memory block MB0 with a corresponding redundancy cell in the redundancy block 314 as a reference numeral 533 indicates. In addition, the fail cell associated with the CSL0 in the memory block MB15 is repaired with a corresponding redundancy cell in the redundancy block 314 as a reference numeral 534 indicates.

When CSL0 operation 542 in each of the memory blocks 311~314 is designated by the access column address CADDR, a first normal cell corresponding to the CSL3 instead of the fail cell is selected in the memory block MB0, a normal cell corresponding to the CSL0 is selected in the memory block MB1, and a redundancy cell corresponding to CSL0 is selected instead of the fail cell in the memory block MB15.

When CSL3 operation 543 in each of the memory blocks 311~314 is designated by the access column address CADDR, a second normal cell corresponding to CSL7 is selected instead of the first normal cell in the memory block, a normal cell corresponding to CSL3 is selected in the memory block MB1 and a normal cell normal cell corresponding to CSL3 is selected in the memory block MB15.

When CSL7 operation 544 in each of the memory blocks 311~314 is designated by the access column address CADDR, a corresponding redundancy cell corresponding to CSL7 is selected instead of a normal cell corresponding to CSL7 in the memory block MB0, a normal cell corresponding to CSL7 is selected in the memory block MB1 and a normal cell normal cell corresponding to CSL7 is selected in the memory block MB15.

As can be seen in FIG. 16A, similar to FIG. 6A, the repair control circuit is configured to replace a first normal memory cell in a first column of the first memory block (e.g., a cell in the column numbered 3 in memory block MB0) with a second normal memory cell in a second column of the first memory block (e.g., a cell in the column numbered 7 in memory block MB0), and to replace the second normal memory cell of the second column of the first memory block by using a first redundancy memory cell in a first column of redundancy memory cells of the first redundancy block (e.g., the column numbered 7 in redundancy block RMB). In this example, replacing the second normal memory cell by using the first redundancy memory cell includes causing the first redundancy memory cell to store data destined for the second normal memory cell. As further shown in FIG. 16, the repair circuit is further configured to repair a failed memory cell in another column of the first memory block (e.g., the column numbered 0 in memory block MB0) with the first normal memory cell (e.g., the cell in the column numbered 3 in memory block MB0).

Figure 16B:
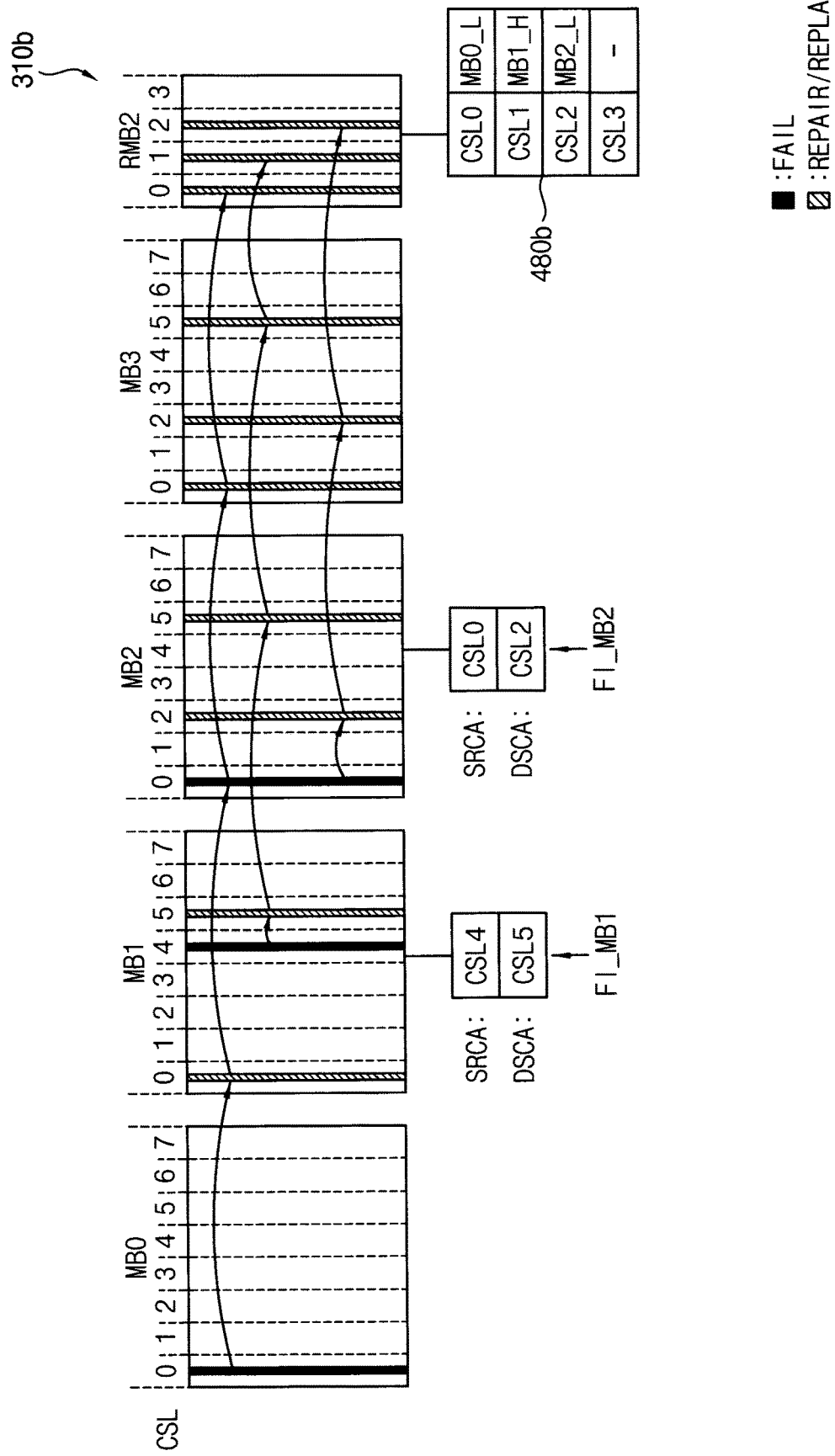
FIG. 16B illustrates another example of the first bank array in the semiconductor memory device of FIG. 15.

FIG. 16B illustrates another example of the first bank array in the semiconductor memory device of FIG. 15.

In FIG. 16B, each size of memory blocks MB0~MB3 is greater than a size of a redundancy block RMB2 in a first bank array 310b whereas each size of the memory blocks MB0~MB15 is the same as a size of the redundancy block RMB in the first bank array 310 in FIG. 16A. Each size of the memory blocks MB0~MB3 is two times greater than the size of the redundancy block RMB2 in the first bank array 310b inn FIG. 16B.

In FIG. 16B, each of the memory blocks MB0~MB3 may be divided into an upper block corresponding to CSL0~CSL3 and a lower block corresponding to CSL4~CSL7 based on a most significant bit (MSB) of the access column address. When fail cells are distributed as in FIG. 16B, the burst operation of the semiconductor memory device 200b may be supported by determining a repair condition such that fail cells in the memory blocks MB0, MB1 and MB2 and redundancy resources in the redundancy block RMB are not overlapped by processing don't care of the MSB of the access column address.

That is, fuse information FI MB1 associated with the memory block MB1 is set to select a normal cell corresponding to CSL5 instead of the fail cell corresponding to CSL4 and fuse information FI MB2 associated with the memory block MB2 is set to select a normal cell corresponding to CSL2 instead of the fail cell corresponding to CSL0. In addition, when CSL0 and CSL4 are designated in each of the memory blocks MB0~MB3, a redundancy cell corresponding to CSL0 is selected in the redundancy block RMB2. A fuse circuit 480b may store fuse information MB_L, MB1_H, and MB2_H for CSL0, CSL1 and CSL2 operations, respectively.

Figure 16C:
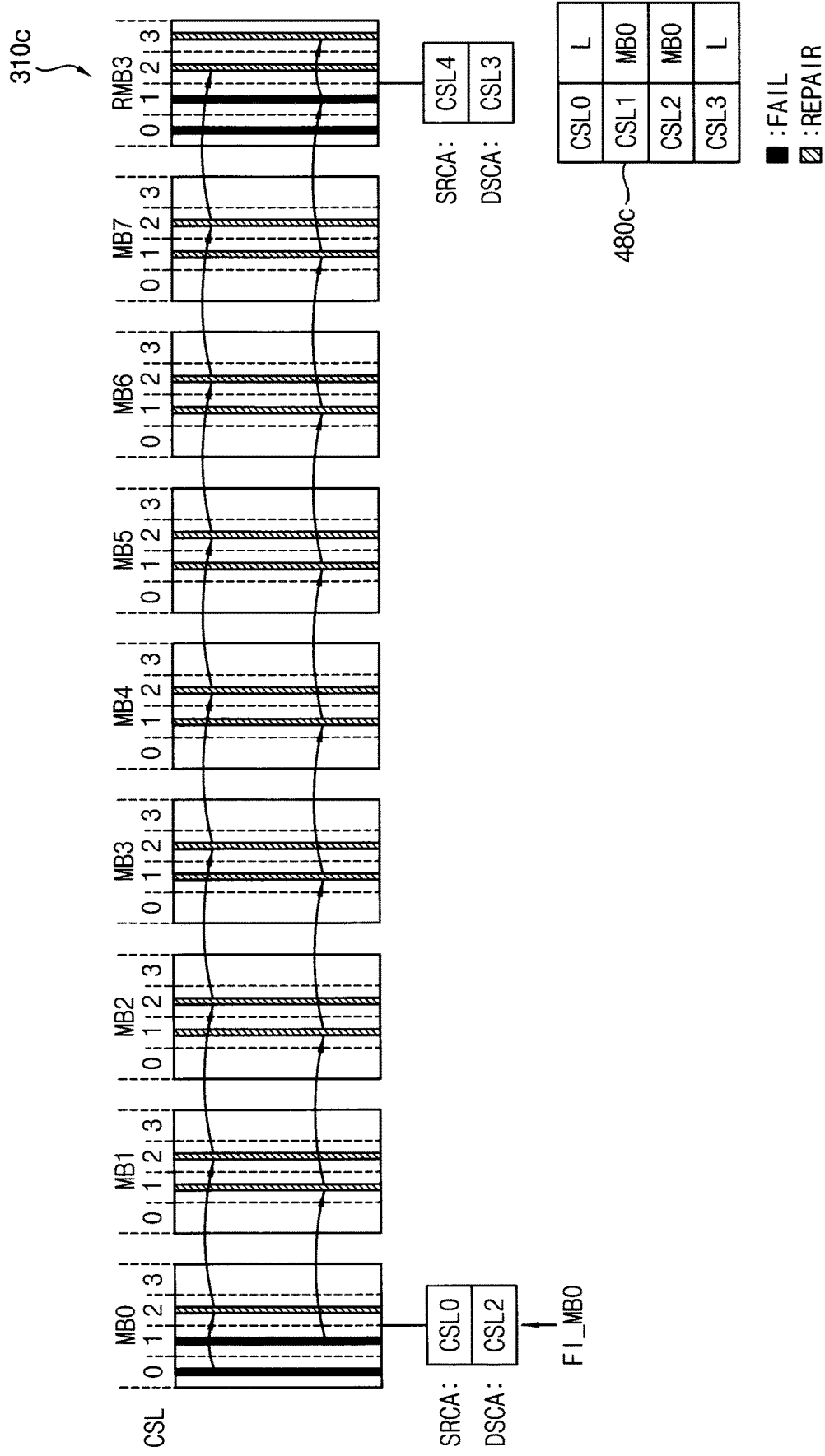
FIG. 16C illustrates another example of the first bank array in the semiconductor memory device of FIG. 15.

FIG. 16C illustrates another example of the first bank array in the semiconductor memory device of FIG. 15.

In FIG. 16C, each size of the memory blocks MB0~MB7 is the same as a size of a redundancy block RMB3 in a first bank array 310c.

Referring to FIG. 16C, the first bank array 310c may include a plurality of memory blocks MB0~MB7 and a redundancy block RMB3.

The memory block MB0 includes first and second fail cells on bit-lines selected by column selection line signal CSL0 and CSL1 and the redundancy memory block RMB3 includes first and second fail redundancy cells on bit-lines selected by the column selection line signal CSL0 and CSL1. The first fail cell in the memory block MB0 is repaired by a first normal cell in the memory block MB0 by enabling a column selection line signal CSL3 instead of the column selection line signal CSL0. The first normal cell in the memory block MB0 is sequentially replaced by a second normal cell in each of the memory blocks MB1~MB7 and a third redundancy cell in the redundancy block RMB3. The first fail cell in the memory block MB0 is repaired by a first normal cell in the memory block MB0 by enabling a column selection line signal CSL3 instead of the column selection line signal CSL0. The second fail cell in the memory block MB0 is sequentially replaced by a second normal cell in each of the memory blocks MB1~MB7 and a second redundancy cell in the redundancy block RMB3 and the second redundancy cell in the redundancy block RMB3 is replaced by a fourth redundancy cell in the redundancy block RMB3 because the second redundancy cell in the redundancy block RMB3 is a fail redundancy cell.

In FIG. 16C, a burst operation of the semiconductor memory device 200b may be supported by determining a repair condition for repairing the fail cells in the memory block MB0 such that redundancy resources in the RMB3 are not overlapped.

That is, fuse information FI MB0 is set to select a normal cell corresponding to CSL2 instead of the fail cell corresponding to the CSL0 associated with the memory block MB0 and fuse information FI RMB3 is set to select the redundancy cell corresponding to CSL3 instead of the fail redundancy cell corresponding to the CSL1 associated with the redundancy cell RMB3. A fuse circuit 480c may store fuse information for CSL1 and CSL2 respectively.

Figure 17A:
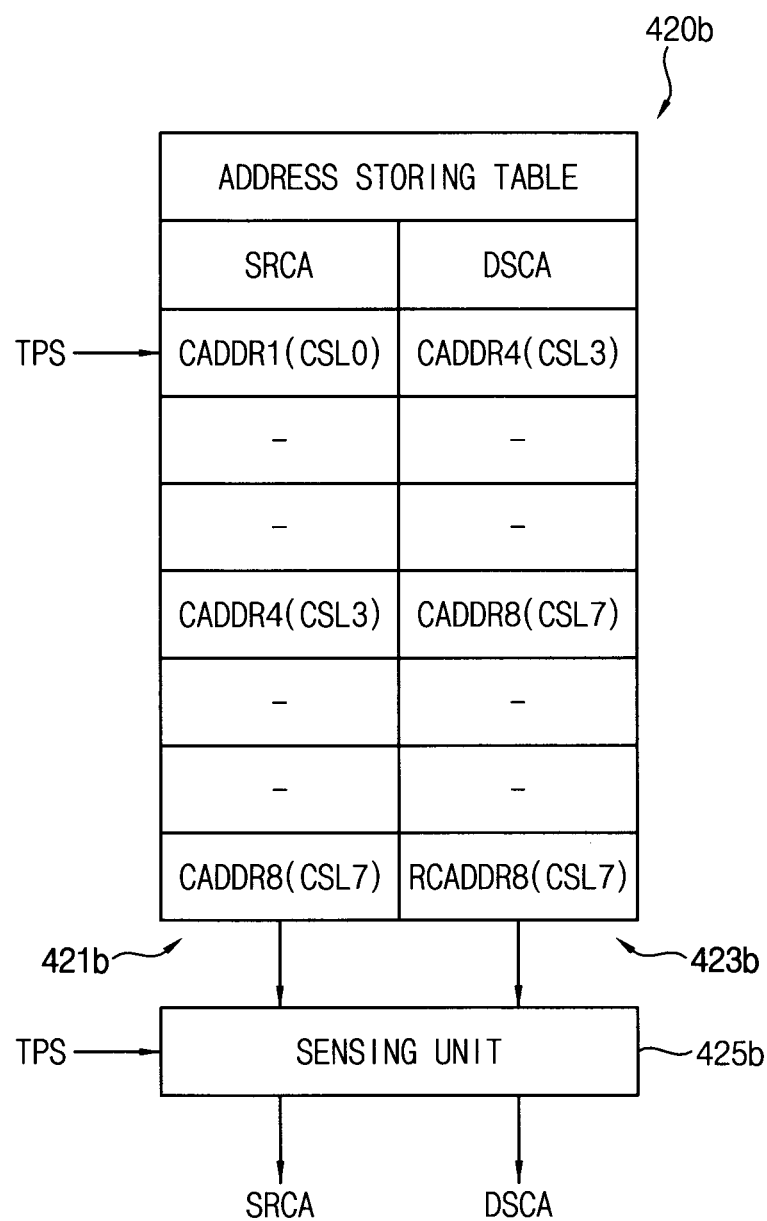
FIG. 17A illustrates an example of the address storage table in the repair control circuit of FIG. 13 according to exemplary embodiments.

FIG. 17A illustrates an example of the address storage table in the repair control circuit of FIG. 13.

Referring to FIG. 17A, the address storage table 420b includes a first storage unit 421b, a second storage unit 423b and a sensing unit 425b. The first storage unit 421b stores the source column address SRCA to be repaired and the second storage unit 423b stores the destination column address DSCA to replace the source column address SRCA. The address storage table 420b may be implemented as an anti-fuse array or a content addressable memory (CAM). The sensing unit 425b outputs the source column address SRCA and the destination column address DSCA stored in a location (indicated by the pointer signal TPS) in the first storage unit 421b and the second storage unit 423b in response to on the pointer signal TPS. In FIG. 17, the address storage table 420b stores a column address CADDR1 associated with CSL0, a column address CADDR4 associated with CSL3 and a column address CADDR8 associated with CSL7 as the source column address SRCA and stores the column address CADDR4 to replace the column address CADDR1, the column address CADDR7 to replace the column address CADDR4 and a redundancy column address RCADDR4 to replace the column address CADDR8 as the destination column address DSCA.

FIG. 17B illustrates an example that reduces a number of fuses associated with a repair operation according to example embodiments.

Referring to FIG. 17B, a master fuse information MFB may include two bits and the master fuse information MFB may have one of '00', '01', 10' and '11'. In FIG. 17B, the master fuse information MFB is merged with a fuse information FFI of fail cells.

In FIG. 17B, six bit fuse information may designate forty eight addresses. For example, the master fuse information MFB of '00' may indicate that the repair operation is not applied, the master fuse information MFB of '01', 10' and '11' may be used as information for designating fail cells. In addition, the fuse information FFI of fail cells having four bits may designate sixteen addresses. That is, each of the master fuse information MFB of '01', 10' and '11' merged with the fuse information FFI of fail cells may designate sixteen addresses, and six bit fuse information may designate forty eight addresses. When thirty four addresses of the forty eight addresses are used, one of the six bits of fuse information may be reduced.

FIG. 17C illustrates another example that reduces a number of fuses associated with a repair operation according to example embodiments.

Referring to FIG. 17C, one of a source information SR and a destination information DS may be merged with the master fuse information MFB. FIG. 17C illustrates that the destination information DS is merged with the master fuse information MFB and merged information MFB&DS is generated. The merged information MFB&DS includes three bits and source fuse information SRFI includes six bits. In FIG. 17C, one bit associated with a memory block MB is shared by two adjacent column blocks and a number of fuses may be reduced.

FIG. 17D illustrates an example that implements the example of FIG. 17C in detail.

Referring to FIG. 17D, master fuse information MFB' merged with the destination information, corresponding to the merged information MFB&DS in FIG. 17C may include three bits of pattern S[9] S[8]S[7]. When the pattern S[9] S[8]S[7] has a value of '000', it denotes that the repair operation is not used. When the pattern S[9] S[8]S[7] has a value other than '000', the master fuse information MFB' may include a portion of bits of destination information or bits of address to designate a normal cell. As illustrated in FIG. 17D, a column address CADDR of a normal cell as the destination information may be obtained by selectively flipping upper three bits CA9, CA8 and CA7 of the source information.

Figure 17E:
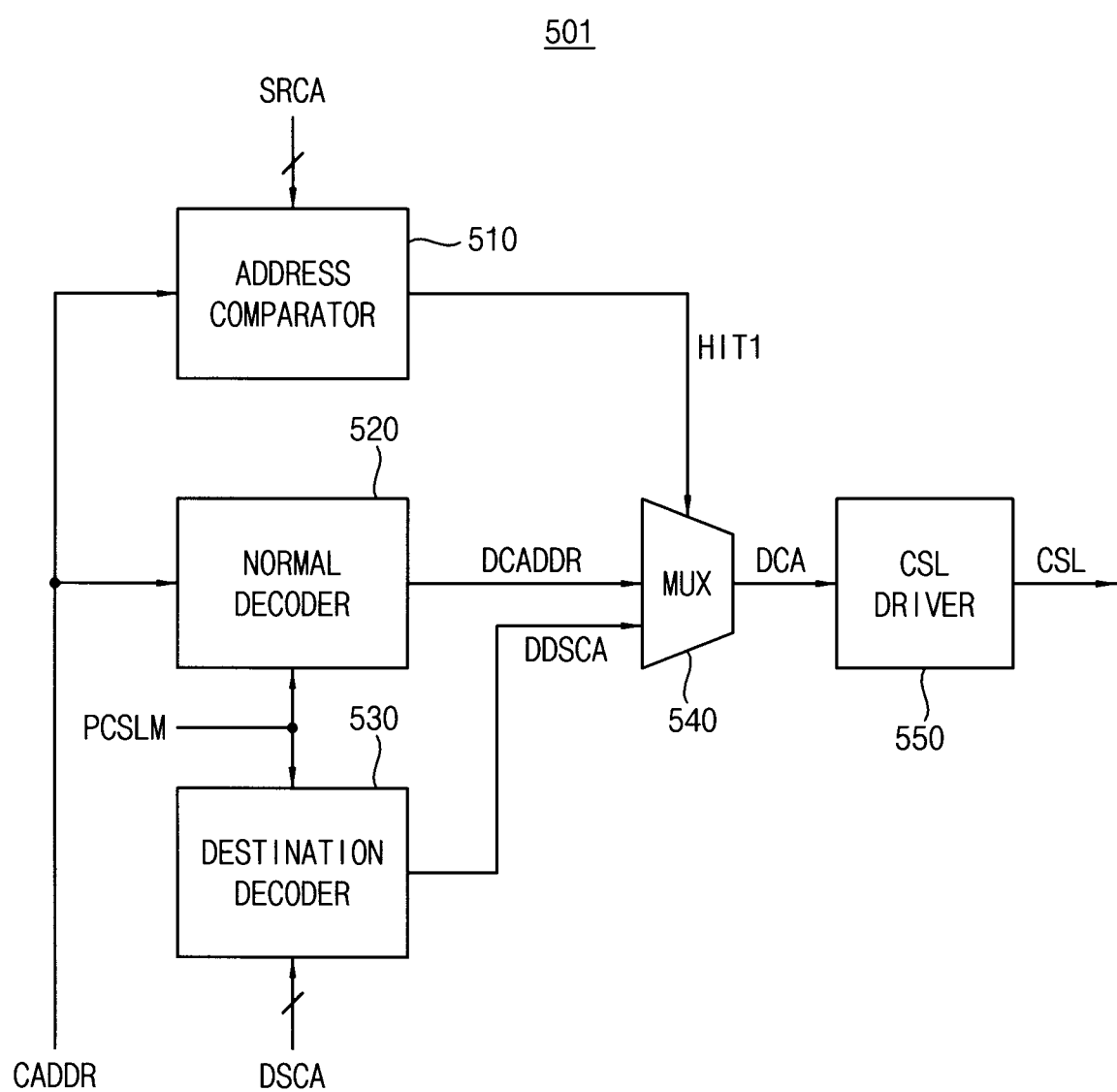
FIG. 17E illustrates an example of a unit repair controller according to example embodiments.

FIG. 17E illustrates an example of a unit repair controller according to example embodiments.

Referring to FIG. 17E, a unit repair controller 501 may include a column address comparator 510, a normal decoder 520, a destination decoder 530, a multiplexer 540 and a column selection line driver 550.

The column address comparator 510 compares the access column address CADDR and the source column address SRCA output from the address storage table 420b in FIG. 13 and outputs a hit signal HIT1 indicating a result of comparison of the access column address CADDR and the source column address SRCA. The normal decoder 520 decodes the access column address CADDR in response to a column selection master signal PCSLM to output a first decoded column address DCADDR.

The destination decoder 530 decodes the destination column address DSCA output from the address storage table 420b in response to the column selection master signal PCSLM to output a second decoded column address DDSCA.

The multiplexer 540 selects one of the first decoded column address DCADDR and the second decoded column address DDSCA in response to the hit signal HIT to output a selected one as the decoded target column address DCA. The column selection line driver 550 receives the decoded target column address DCA and outputs the column selection line signal to select (activate) a bit-line corresponding to the decoded target column address DCA.

Figure 17F:
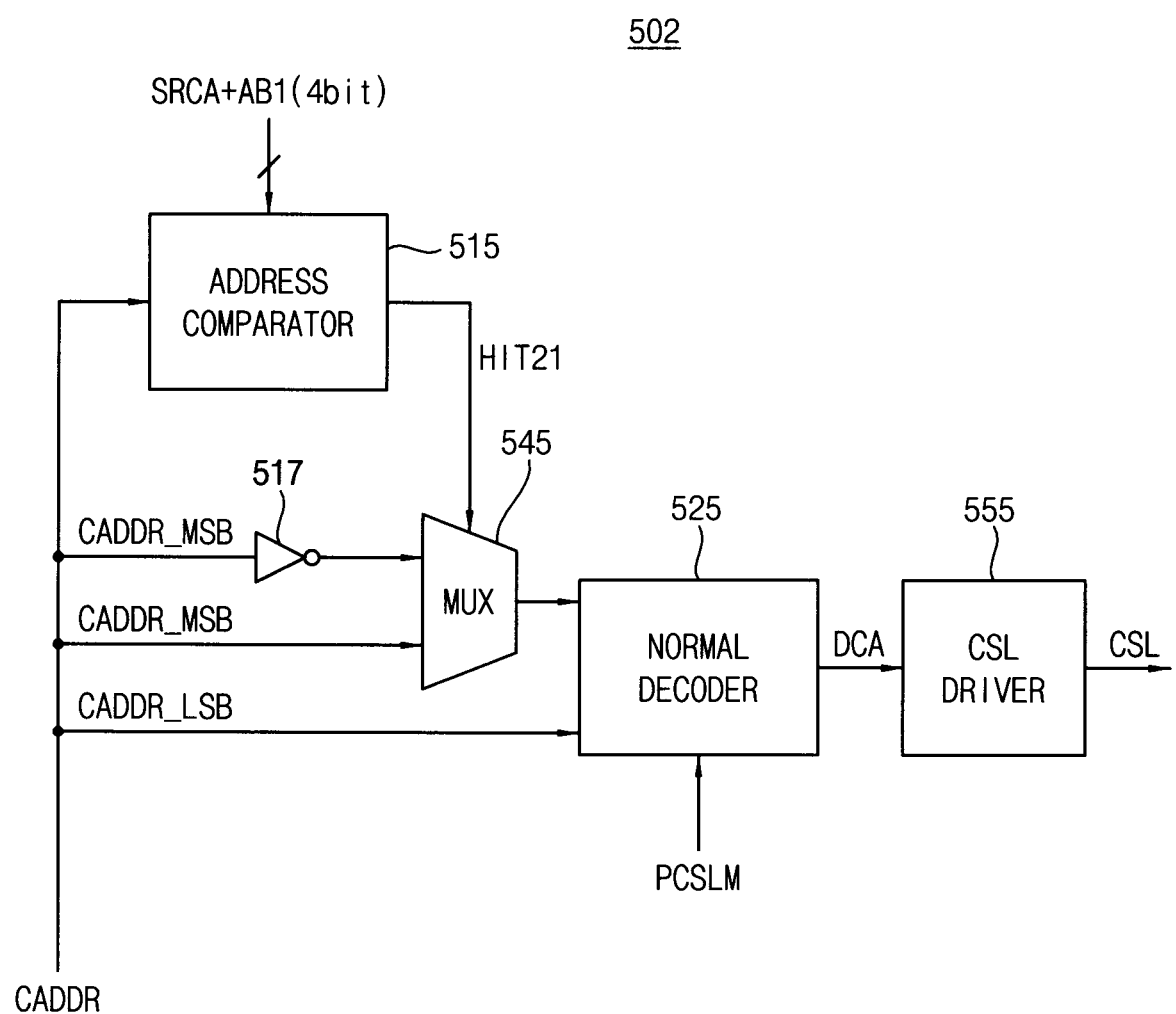
FIG. 17F illustrates another example of a unit repair controller according to example embodiments.

FIG. 17F illustrates another example of a unit repair controller according to example embodiments.

Referring to FIG. 17F, a unit repair controller 502 may include a column address comparator 515, an inverter 517, a multiplexer 545, a normal decoder 525 and a column selection line driver 555.

The column address comparator 515 compares the access column address CADDR with the source column address SRCA and additional bits AB1 and outputs a hit signal HIT21 indicating a result of comparison of the access column address CADDR with the source column address SRCA and the additional bits AB1. The additional bits AB1 may include four bits.

Three bits of the additional bits AB1 may correspond to the master fuse information MFB' merged with the destination information DS as described with reference to FIG. 17C and one bit of the additional bits AB1 may be a bit shared by two adjacent column blocks.

The access column address CADDR may include upper bits CADDR_MSB and lower bits CADDR_LSB. The inverter 517 inverts the upper bits CADDR_MSB of the access column address CADDR. The multiplexer 545 outputs one of an output of the inverter 517 and the lower bits CADDR_LSB of the access column address CADDR in response to the hit signal HIT21.

The normal decoder 525 decodes an output of the multiplexer 525 and the lower bits CADDR_LSB of the access column address CADDR in response to the column selection master signal PCSLM to output the decoded target column address DCA. The column selection line driver 550 receives the decoded target column address DCA and outputs the column selection line signal CSL to select (activate) a bit-line corresponding to the decoded target column address DCA.

The upper bits CADDR_MSB of the access column address CADDR may be coded as illustrated in FIG. 17D.

The unit repair controller 501 of FIG. 17E and the unit repair controller 502 of FIG. 17F may be employed when a fail cell in a memory block is repaired with a normal cell in the same memory block.

Figure 17G:
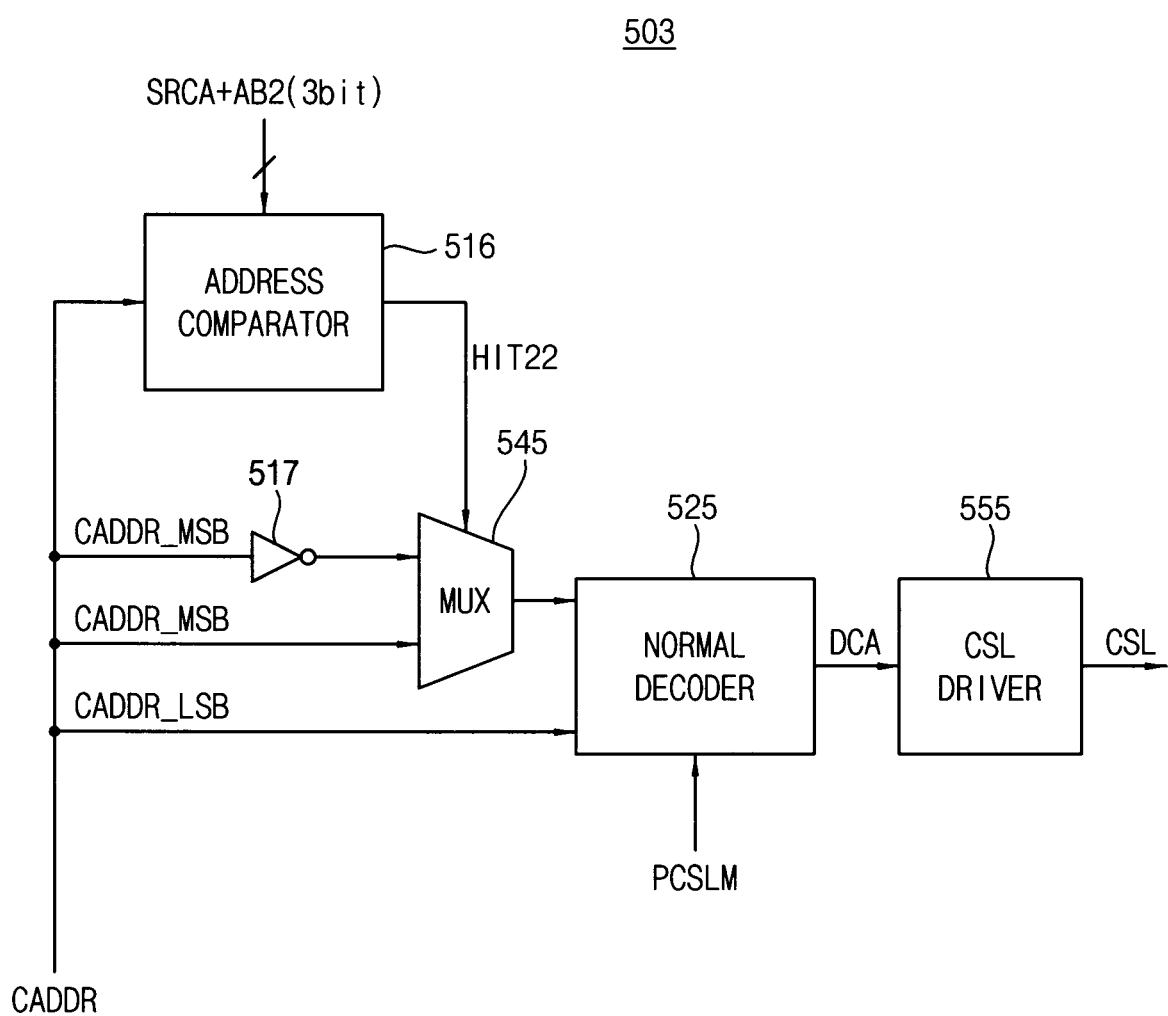
FIG. 17G illustrates another example of a unit repair controller according to example embodiments.

FIG. 17G illustrates another example of a unit repair controller according to example embodiments.

Referring to FIG. 17G, a unit repair controller 503 may include a column address comparator 516, an inverter 517, a multiplexer 545, a normal decoder 525 and a column selection line driver 555.

The column address comparator 516 compares the access column address CADDR with the source column address SRCA and additional bits AB2 and outputs a hit signal HIT22 indicating a result of comparison of the access column address CADDR with the source column address SRCA and the additional bits AB2. The additional bits AB2 may include three bits.

The access column address CADDR may include upper bits CADDR_MSB and lower bits CADDR_LSB. The inverter 517 inverts the upper bits CADDR_MSB of the access column address CADDR. The multiplexer 545 outputs one of an output of the inverter 517 and the lower bits CADDR_LSB of the access column address CADDR in response to the hit signal HIT22.

The normal decoder 525 decodes an output of the multiplexer 545 and the lower bits CADDR_LSB of the access column address CADDR in response to the column selection master signal PCSLM to output the decoded target column address DCA. The column selection line driver 555 receives the decoded target column address DCA and outputs the column selection line signal CSL to select (activate) a bit-line corresponding to the decoded target column address DCA.

The upper bits CADDR_MSB of the access column address CADDR may be coded as illustrated in FIG. 17D.

The additional bit AB2 includes three bit because two adjacent memory blocks share a fuse. In addition, the unit repair controller 503 of FIG. 17G may be employed when a fail cell in a memory block is repaired with a normal cell in the same memory block.

Figure 17H:
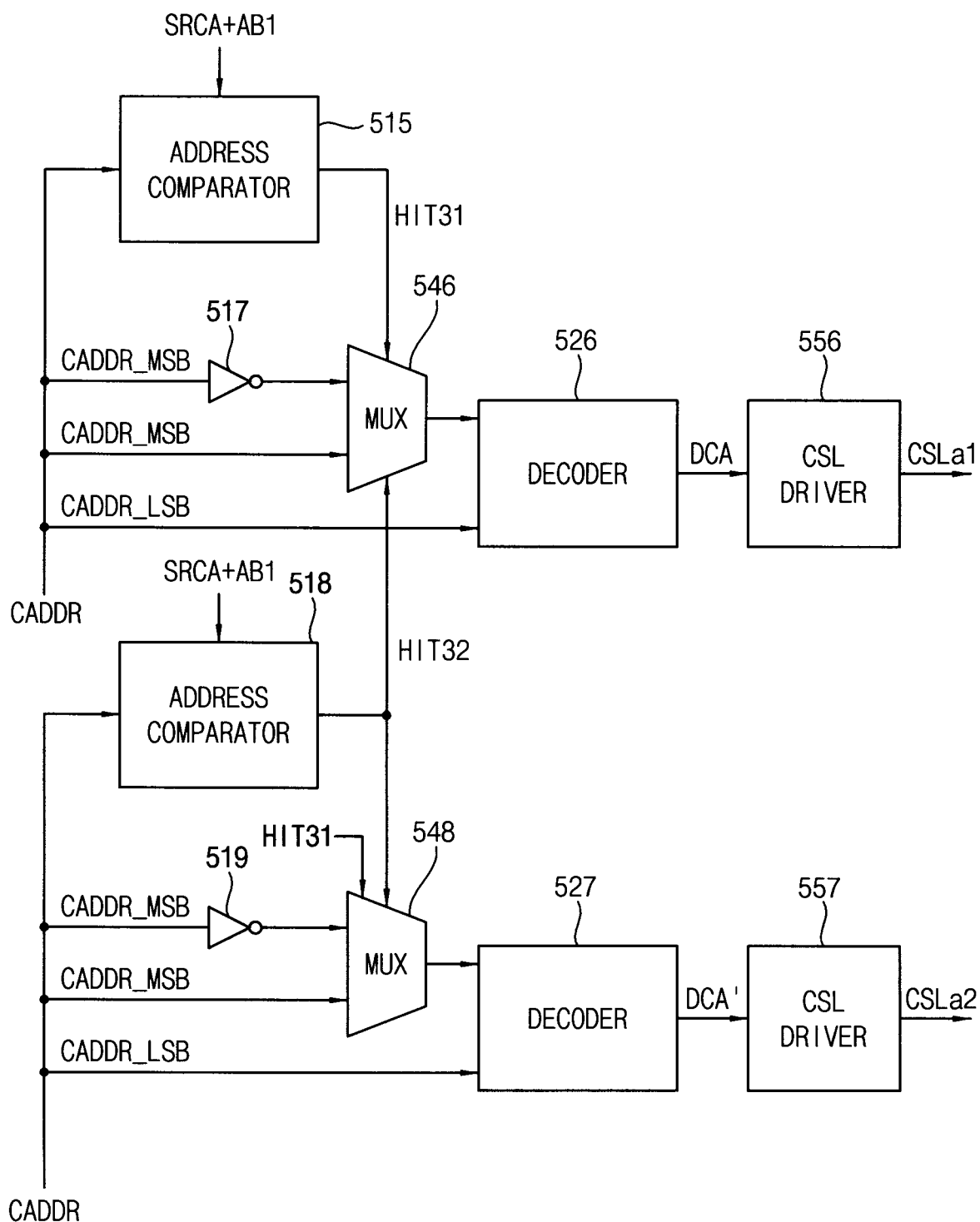
FIG. 17H illustrates another example of a unit repair controller according to example embodiments.

FIG. 17H illustrates another example of a unit repair controller according to example embodiments.

Referring to FIG. 17H, a unit repair controller 503 may include a column address comparator 516, an inverter 517, a multiplexer 546, a decoder 526, a column selection line driver 556, a column address comparator 518, an inverter 519, a multiplexer 548, a decoder 527 and a column selection line driver 557.

The column address comparator 515 compares the access column address CADDR with the source column address SRCA and the additional bits AB1 including four bits and outputs a hit signal HIT31 indicating a result of a comparison of the access column address CADDR with the source column address SRCA and the additional bits AB1.

The access column address CADDR may include upper bits CADDR_MSB and lower bits CADDR_LSB. The inverter 517 inverts the upper bits CADDR_MSB of the access column address CADDR.

The column address comparator 518 compares the access column address CADDR with the source column address SRCA and the additional bits AB1 and outputs a hit signal HIT32 indicating a result of comparison of the access column address CADDR with the source column address SRCA and the additional bits AB1.

The inverter 519 inverts the upper bits CADDR_MSB of the access column address CADDR.

The multiplexer 546 outputs one of an output of the inverter 517 and the lower bits CADDR_LSB of the access column address CADDR. The decoder 526 decodes an output of the multiplexer 546 and the lower bits CADDR_LSB of the access column address CADDR to output the decoded target column address DCA. The column selection line driver 556 receives the decoded target column address DCA and outputs the column selection line signal CSLa1 to select (activate) a bit-line corresponding to the decoded target column address DCA.

The multiplexer 548 outputs one of an output of the inverter 519 and the lower bits CADDR_LSB of the access column address CADDR. The decoder 527 decodes an output of the multiplexer 548 and the lower bits CADDR_LSB of the access column address CADDR to output a decoded target column address DCA'. The column selection line driver 557 receives the decoded target column address DCA' and outputs the column selection line signal CSLa2 to select (activate) a bit-line corresponding to the decoded target column address DCA'.

The unit repair controller 504 of FIG. 17H may be employed when a fail cell is repaired with a normal cell in two adjacent memory blocks.

Figure 18:
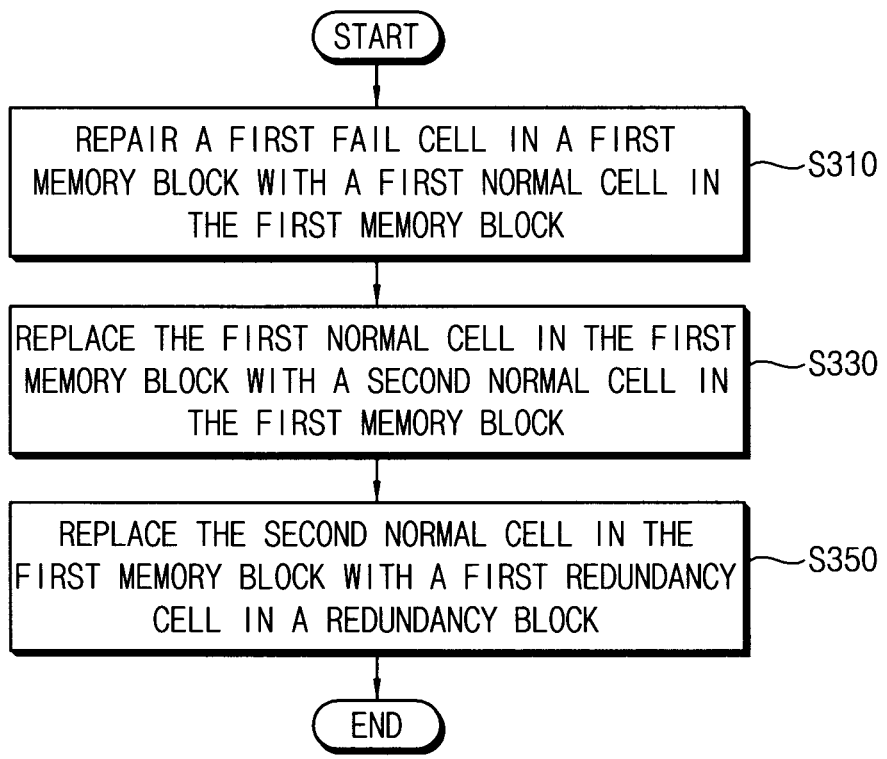
FIG. 18 is a flow chart illustrating a method of operating a semiconductor memory device according to exemplary embodiments.

FIG. 18 is a flow chart illustrating a method of operating a semiconductor memory device according to exemplary embodiments.

Referring to FIGS. 11 to 18, in a method of operating a semiconductor memory device 200b including a memory cell array 300 that includes a plurality of memory blocks and at least one redundancy block, the repair control circuit 400b repairs a first fail cell in a first memory block of the plurality of memory blocks with a first normal cell in the first memory block (S310). The repair control circuit 400b repairs the first fail cell with the first normal cell by swapping a first column address designating a first bit-line coupled to the first fail cell with a second column address designating a second bit-line coupled to the first normal cell. The repair control circuit 400b replaces the first fail cell in the first memory block of the plurality of memory blocks with a second normal cell in the first memory block (S330). The first fail cell, the first normal cell and the second normal cell in the first memory block may have different column selection line addresses. For example, the first fail cell, the first normal cell and the second normal cell in the first memory block are coupled to different bit-lines selected by different column selection line (CSL) signals. The first fail cell, the first normal cell, and the second normal cell in the first memory block may be connected to a same I/O circuit.

The repair control circuit 400a replaces the second normal cell in the first memory block with a first redundancy cell in the redundancy block (S350). The second normal cell and the first redundancy cell may have a same column selection line address, and may have the same relative location within the respective memory cell array. The second normal cell and the first redundancy cell may be connected to different I/O circuits, respectively.

Figure 19:
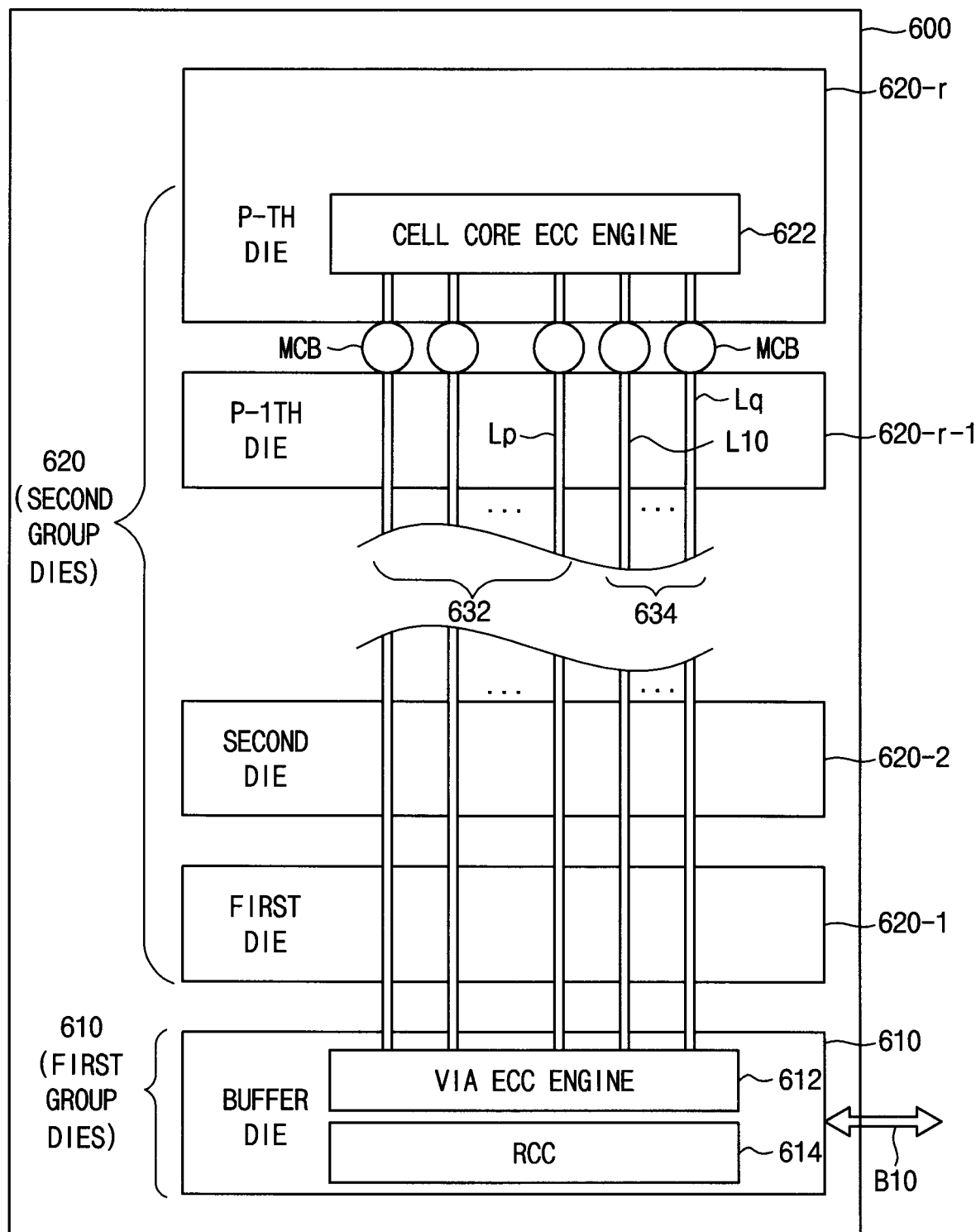
FIG. 19 is a block diagram illustrating a semiconductor memory device according to exemplary embodiments.

FIG. 19 is a block diagram illustrating a semiconductor memory device according to exemplary embodiments.

Referring to FIG. 19, a semiconductor memory device 600 may include first group dies 610 and second group dies 620 providing a soft error analyzing and correcting function in a stacked chip structure.

The first group die 610 may include at least one buffer die. The second group dies 620 may include a plurality of memory dies 620-1 to 620-r which is stacked on the first group die 610 and conveys data through a plurality of through silicon via (TSV) lines.

At least one of the memory dies 620-1 to 620-r may include a first type error correction code (ECC) engine 622 which generates transmission parity bits based on transmission data to be sent to the first group die 610 and an error injection register set 623. The first type ECC engine 622 may be referred to as 'cell core ECC engine'.

The buffer die 610 may include a second type ECC engine 612 which corrects a transmission error using the transmission parity bits when a transmission error is detected from the transmission data received through the TSV lines and generates error-corrected data. The second type ECC engine 612 may be referred to as 'via ECC engine'. The buffer die 610 may include a repair control circuit 614 and the repair control circuit 614 may employ the repair control circuit 400b of FIG. 13.

The semiconductor memory device 600 may be a stack chip type memory device or a stacked memory device which conveys data and control signals through the TSV lines. The TSV lines may be also called 'through electrodes'.

The first type ECC engine 622 may perform error correction on data which is outputted from the memory die 620-p before the transmission data is sent.

With the above description, a TSV line group 632 which is formed at one memory die 620-r may include a plurality of TSV lines L1 to Lp, and a parity TSV line group 634 may include a plurality of TSV lines L10 to Lq. The TSV lines L1 to Lp of the data TSV line group 632 and the parity TSV lines L10 to Lq of the parity TSV line group 634 may be connected to micro bumps MCB which are correspondingly formed among the memory dies 620-1 to 620-r.

At least one of the memory dies 620-1 to 620-r may include DRAM cells each including at least one access transistor and one storage capacitor.

The semiconductor memory device 600 may have a three-dimensional (3D) chip structure or a 2.5D chip structure to communicate with the memory controller through a data bus B10. The buffer die 610 may be connected with the memory controller through the data bus B10.

The first type ECC engine 622, denoted as the cell core ECC engine, may output transmission parity bits as well as the transmission data through the parity TSV line group 634 and the data TSV line group 632 respectively. The outputted transmission data may be data which is error-corrected by the first type ECC engine 622.

The second type ECC engine 612, denoted as the via ECC engine, may determine whether a transmission error occurs at the transmission data received through the data TSV line group 632, based on the transmission parity bits received through the parity TSV line group 634. When a transmission error is detected, the second type ECC engine 612 may correct the transmission error on the transmission data using the transmission parity bits. When the transmission error is uncorrectable, the second type ECC engine 612 may output information indicating occurrence of an uncorrectable data error.

Figure 20:
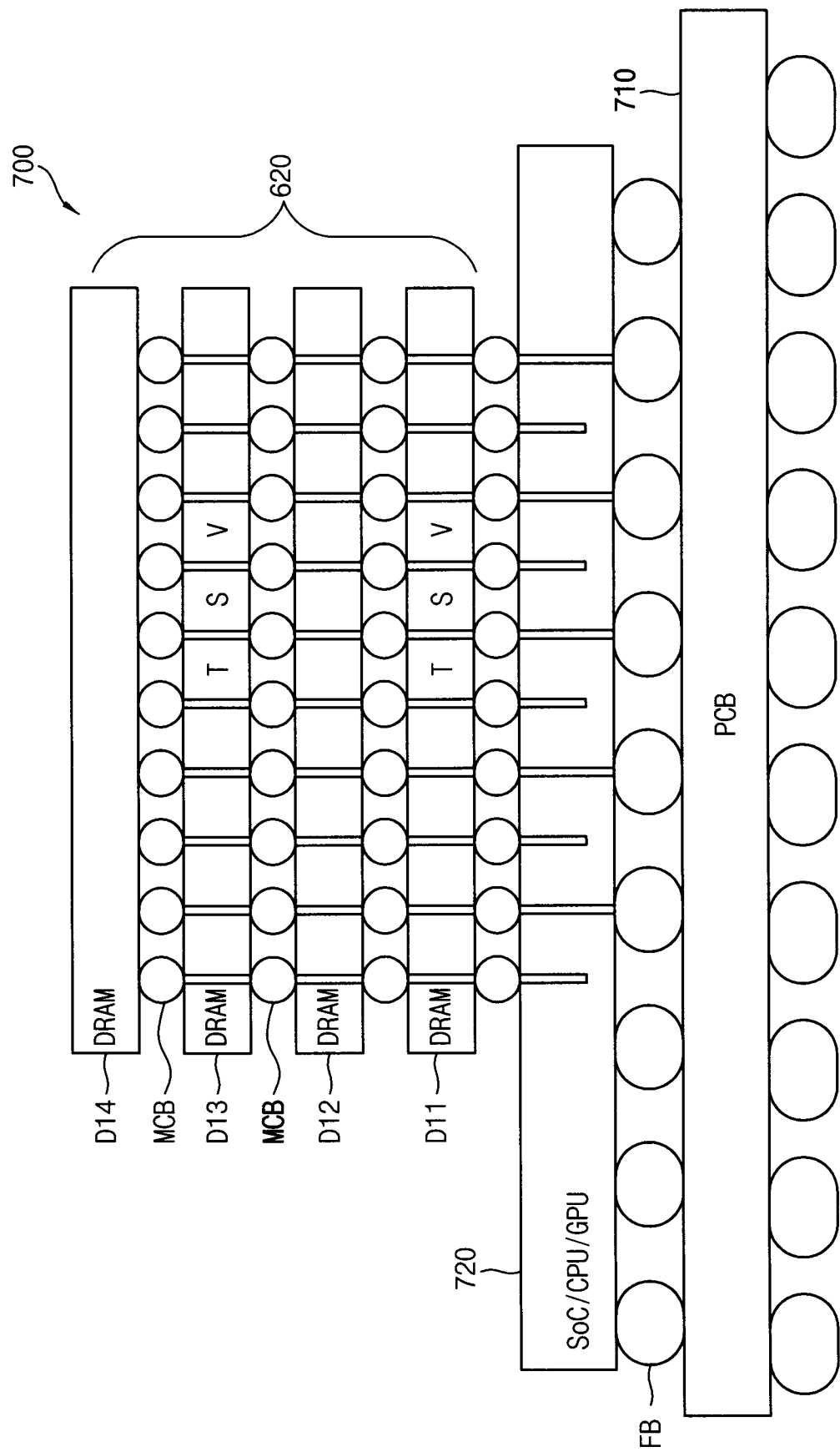
FIG. 20 is a cross-sectional view of a 3D chip structure employing the semiconductor memory device of FIG. 19 according to exemplary embodiments.

FIG. 20 is a cross-sectional view of a 3D chip structure employing the semiconductor memory device of FIG. 19 according to exemplary embodiments.

FIG. 20 shows a 3D chip structure 700 in which a host and a high-bandwidth memory (HBM) are directly connected without an interposer layer.

Referring to FIG. 20, a host die 720 such as a system-on-chip (SoC), a central processing unit (CPU), or a graphic processing unit (GPU) may be disposed on a printed circuit board (PCB) 710 using flip chip bumps FB. Memory dies D11 to D14 may be stacked on the host die 720 to implement a HBM structure. In FIG. 20, the buffer die 610 or a logic die of FIG. 19 is omitted. However, the buffer die 610 or the logic die may be disposed between the memory die D11 and the host die 710. To implement the HBM (620) structure, TSV lines may be formed at the memory dies D11 and D14. The TSV lines may be electrically connected with micro bumps MCB placed between memory dies.

Aspects of the present inventive concept may be applied to systems using semiconductor memory devices.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept.

The invention claimed is:

1. A method of replacing a memory cell in a first column of a memory block in a memory device including a plurality of memory blocks and at least a first redundancy block, the method including:

replacing an address of a first normal memory cell in a first column of a first memory block with a destination address that is an address of a second normal memory cell in a second column of the first memory block;

reassigning the address of the second normal memory cell in the second column of the first memory block to an address of a first redundancy memory cell in a redundancy block of the memory device; and, replacing an address of a second normal memory cell in a first column of a second memory block with an address of a second destination memory cell in a second column of the second memory block, wherein the second destination memory cell is a normal memory cell, wherein;

the first column of the first memory block and the first column of the second memory block have the same relative location with respect to the columns of their respective memory blocks, and the second column of the first memory block and the second column of the second memory block have a different relative location with respect to the columns of their respective memory blocks.

2. The method of claim 1, wherein:
the first normal memory cell is a failed cell, and replacing the address of the first normal memory cell with the destination address includes repairing the failed cell.

3. The method of claim 1, wherein the first normal memory cell is accessed using a first column select line, and the address of the first normal memory cell includes an address of the first column select line, and further comprising:

replacing the address of the first column select line with an address of a second column select line that accesses the second normal memory cell in the second column.

4. The method of claim 1, further comprising:
replacing the address of the first normal memory cell in the first column of the first memory block based on an address storage table that stores pairings of source addresses that correspond to source memory cells with destination addresses that correspond to destination memory cells.

5. The method of claim 4, wherein:
the first normal memory cell is a failed cell, and replacing the address of the first normal memory cell with the destination address includes repairing the failed cell, and
the source addresses correspond to failed memory cells.

6. The method of claim 4, further comprising:
receiving a first column address for the first column;
comparing the first column address to a first column source address stored in the address storage table; and
when the first column address matches a first column source address stored in the address storage table, outputting a target address to a column select line driver, the target address being a first column destination address corresponding to the first column source address from the address storage table.

7. The method of claim 4, wherein:
the address storage table further stores pairings of destination addresses that correspond to destination memory cells with redundancy addresses that correspond to redundancy memory cells, and further comprising:
reassigning an address of the second normal memory cell in the second column of the first memory block to a redundancy address paired with the address of the second normal memory cell.

8. The method of claim 1, wherein:
the reassigning is based on information relating to column select lines and memory blocks stored in a fuse circuit.

9. The method of claim 1, wherein:
the first column of the first memory block and the second column of the first memory block are separated by at least one column therebetween.

10. The method of claim 1, further comprising:
reassigning an address of the second destination memory cell in the second column of the second memory block to an address of a second redundancy memory cell in the redundancy block of the memory device,
wherein:
the first redundancy memory cell is in a first column of the redundancy block, and
the second redundancy memory cell is in a second column of the redundancy block.

* * * * *